US009337200B2

(12) United States Patent
Ho et al.

(10) Patent No.: US 9,337,200 B2

(45) Date of Patent: May 10, 2016

(54) DYNAMIC RANDOM ACCESS MEMORY CELL EMPLOYING TRENCHES LOCATED BETWEEN LENGTHWISE EDGES OF SEMICONDUCTOR FINS

(71) Applicant: International Business Machines Corporation, Armonk, NY (US)

(72) Inventors: Herbert L. Ho, New Windsor, NY (US); Ravikumar Ramachandran, Pleasantville, NY (US); Reinaldo A. Vega, Wappingers Falls, NY (US)

(73) Assignee: GLOBALFOUNDRIES INC., Grand Cayman (KY)

(*) Notice: Subject to any disclaimer, the term of this patent is extended or adjusted under 35 U.S.C. 154(b) by 91 days.

(21) Appl. No.: 14/087,819

(22) Filed: Nov. 22, 2013

(65) Prior Publication Data

US 2015/0145010 A1 May 28, 2015

(51) Int. Cl.

| | |
|---|---|
| ***H01L 27/10*** | (2006.01) |
| ***H01L 27/108*** | (2006.01) |
| ***H01L 29/417*** | (2006.01) |
| ***H01L 21/762*** | (2006.01) |
| ***H01L 29/66*** | (2006.01) |
| ***H01L 29/94*** | (2006.01) |

(52) U.S. Cl.

CPC .... *H01L 27/10867* (2013.01); *H01L 21/76224* (2013.01); *H01L 27/10826* (2013.01); *H01L 27/10829* (2013.01); *H01L 27/10879* (2013.01); *H01L 29/41783* (2013.01); *H01L 29/66181* (2013.01); *H01L 29/945* (2013.01)

(58) Field of Classification Search

CPC ............ H01L 29/945; H01L 29/66181; H01L 27/10829; H01L 27/10861; H01L 27/10852; H01L 27/1087; H01L 27/10867

USPC .................................. 257/298–311; 438/243

See application file for complete search history.

(56) References Cited

U.S. PATENT DOCUMENTS

| | | | |
|---|---|---|---|
| 7,301,192 | B2 | 11/2007 | Harter et al. |
| 7,371,645 | B2 | 5/2008 | Muemmler et al. |
| 7,445,985 | B2 | 11/2008 | Schwerin |
| 7,615,443 | B2 | 11/2009 | Cheng et al. |
| 7,811,881 | B2 | 10/2010 | Cheng et al. |
| 8,039,326 | B2 | 10/2011 | Knorr et al. |
| 8,421,139 | B2 | 4/2013 | Kanakasabapathy et al. |
| 2007/0176253 | A1 | 8/2007 | Wang et al. |
| 2009/0137093 | A1 | 5/2009 | Lin |
| 2013/0092992 | A1 | 4/2013 | Chang et al. |
| 2013/0320422 | A1* | 12/2013 | Chang .............. H01L 27/10826 257/301 |

* cited by examiner

*Primary Examiner* — Monica D Harrison

(74) *Attorney, Agent, or Firm* — Scully Scott Murphy and Presser

(57) ABSTRACT

After formation of semiconductor fins in an upper portion of a bulk semiconductor substrate, a shallow trench isolation layer is formed, which includes a dielectric material and laterally surround lower portions of each semiconductor fin. Trenches are formed between lengthwise sidewalls of neighboring pairs of semiconductor fins. Portions of the shallow trench isolation layer laterally surrounding each trench provide electrical isolation between the buried plate and access transistors. A strap structure can be formed by etching a via cavity overlying a portion of each trench and a source region of the corresponding access transistor, and filling the via cavity with a conductive material. A trench top oxide structure electrically isolates an inner electrode of each trench capacitor from an overlying gate line for the access fin field effect transistor.

20 Claims, 29 Drawing Sheets

DYNAMIC RANDOM ACCESS MEMORY CELL EMPLOYING TRENCHES LOCATED BETWEEN LENGTHWISE EDGES OF SEMICONDUCTOR FINS

BACKGROUND

The present disclosure relates to a semiconductor structure, and particularly to a dynamic random access memory (DRAM) cell including a finFET access transistor and a method of manufacturing the same.

Trench capacitors are used in a variety of semiconductor chips for high areal capacitance and low device leakage. Typically, a trench capacitor provides a capacitance in the range from 4 fF (femto-Farad) to 120 fF. A trench capacitor may be employed as a charge storage unit in a dynamic random access memory (DRAM), which may be provided as a stand-alone semiconductor chip, or may be embedded in a system-on-chip (SoC) semiconductor chip. A trench capacitor may also be employed in a variety of circuit applications such as a charge pump or a capacitive analog component in a radio-frequency (RF) circuit.

When a DRAM is formed in a bulk substrate, a dielectric “collar” was incorporated into a top portion of each trench capacitor. The collar is typically a thick semiconductor oxide portion, which provides in a high enough threshold voltage to prevent inversion of the adjacent substrate material which separates the source region of the access field effect transistor from the buried plate of the trench capacitors when a logic “high” signal is stored in the trench capacitor. As the size of DRAM cells is scaled down, the length and/or width of the trench capacitor become too small to support a thick enough collar, while also leaving room to provide a conformal fill for the inner electrode of the trench capacitor with a conductive material.

While use of a semiconductor-on-oxide (SOI) substrate is an option for providing sufficient electrical isolation between access transistors and the buried plate (which is the outer electrode for the trench capacitors), SOI substrates are more expensive than bulk substrate. In addition, methods for forming a buried insulator layer within a bulk substrate generally require complex processing steps. Thus, a scheme is desired for circumventing the problems of a collar oxide and/or buried insulator formation for trench capacitors.

SUMMARY

After formation of semiconductor fins in an upper portion of a bulk semiconductor substrate, a shallow trench isolation layer is formed, which includes a dielectric material and laterally surround lower portions of each semiconductor fin. Trenches are formed between lengthwise sidewalls of neighboring pairs of semiconductor fins. Portions of the shallow trench isolation layer laterally surrounding each trench provide electrical isolation between the buried plate and access transistors. A strap structure can be formed by etching a via cavity overlying a portion of each trench and a source region of the corresponding access transistor, and filling the via cavity with a conductive material. A trench top oxide structure electrically isolates an inner electrode of each trench capacitor from an overlying gate line for the access fin field effect transistor. An alternating array of semiconductor fins and trenches along the widthwise direction of the semiconductor fins can provide a compact layout for dynamic random access memory cells.

According to an aspect of the present disclosure, a semiconductor structure includes semiconductor fins located on a substrate and a trench capacitor located within the substrate. An entirety of a node dielectric of the trench capacitor is located between a first vertical plane including a proximal lengthwise sidewall of a first semiconductor fin within a neighboring pair of the semiconductor fins and a second vertical plane including a proximal lengthwise sidewall of a second semiconductor fin within the neighboring pair of the semiconductor fins.

According to another aspect of the present disclosure, a method of forming a semiconductor structure is provided. Semiconductor fins are formed on a substrate. An entirety of a node dielectric of a trench capacitor is formed within the substrate between a first vertical plane including a proximal lengthwise sidewall of a first semiconductor fin within a neighboring pair of the semiconductor fins and a second vertical plane including a proximal lengthwise sidewall of a second semiconductor fin within the neighboring pair of the semiconductor fins.

DETAILED DESCRIPTION

Figure 1:
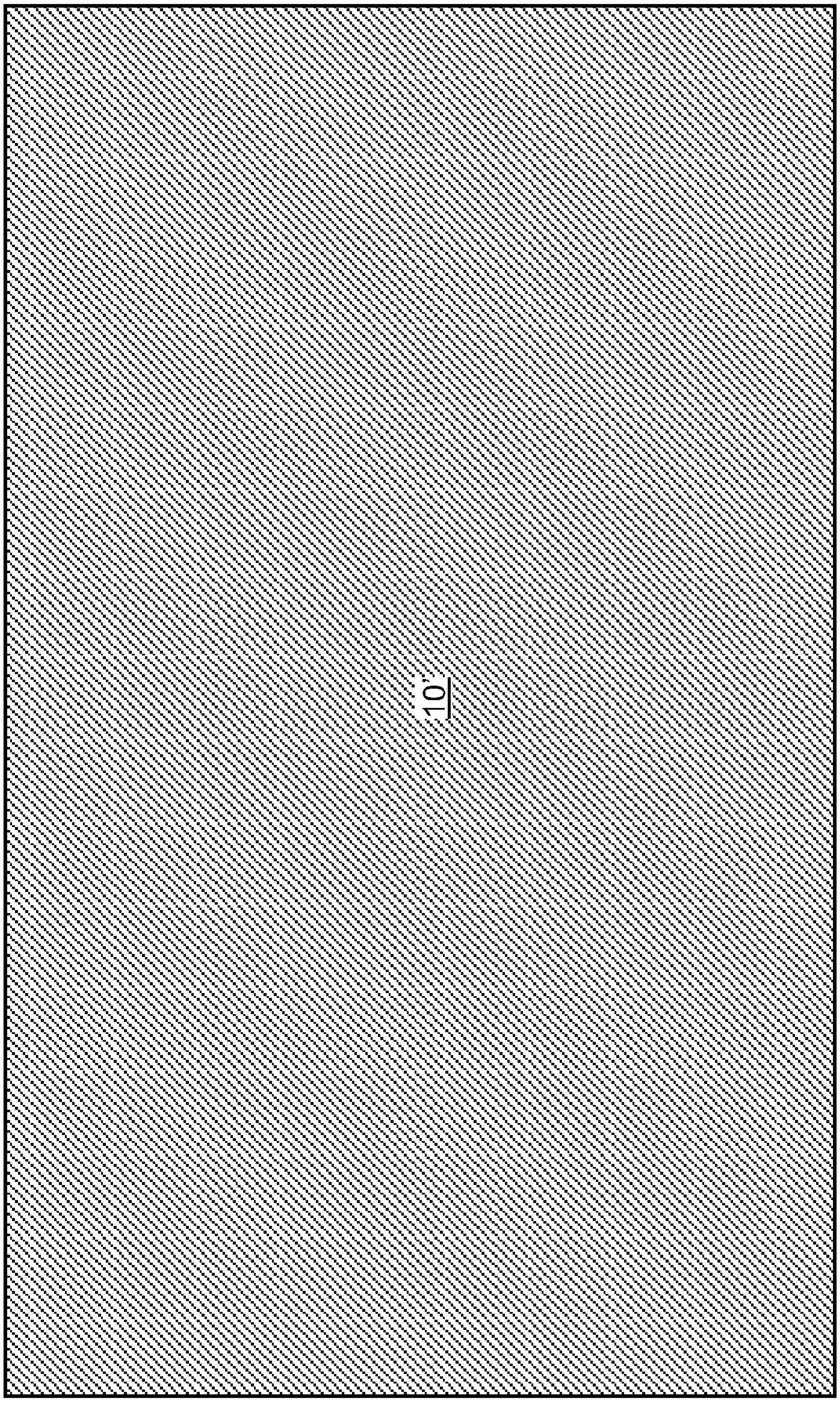
FIG. 1 is a vertical cross-sectional view of a first exemplary semiconductor structure according to a first embodiment of the present disclosure.

As stated above, the present disclosure relates to a dynamic random access memory (DRAM) cell including a finFET access transistor and a method of manufacturing the same. These aspects of the present disclosure are now described in detail with accompanying figures. It is noted that like reference numerals refer to like elements across different embodiments. The drawings are not necessarily drawn to scale.

Referring to FIG. 1, a first exemplary semiconductor structure according to a first embodiment of the present disclosure includes a semiconductor substrate 10', which can be a bulk semiconductor substrate. The semiconductor substrate includes a semiconductor material, which can be selected from elemental semiconductor materials (e.g., silicon, germanium, carbon, or alloys thereof), III-V semiconductor materials, or II-VI semiconductor materials. In one embodiment, the semiconductor substrate can include a single crystalline semiconductor material.

Figure 2A:
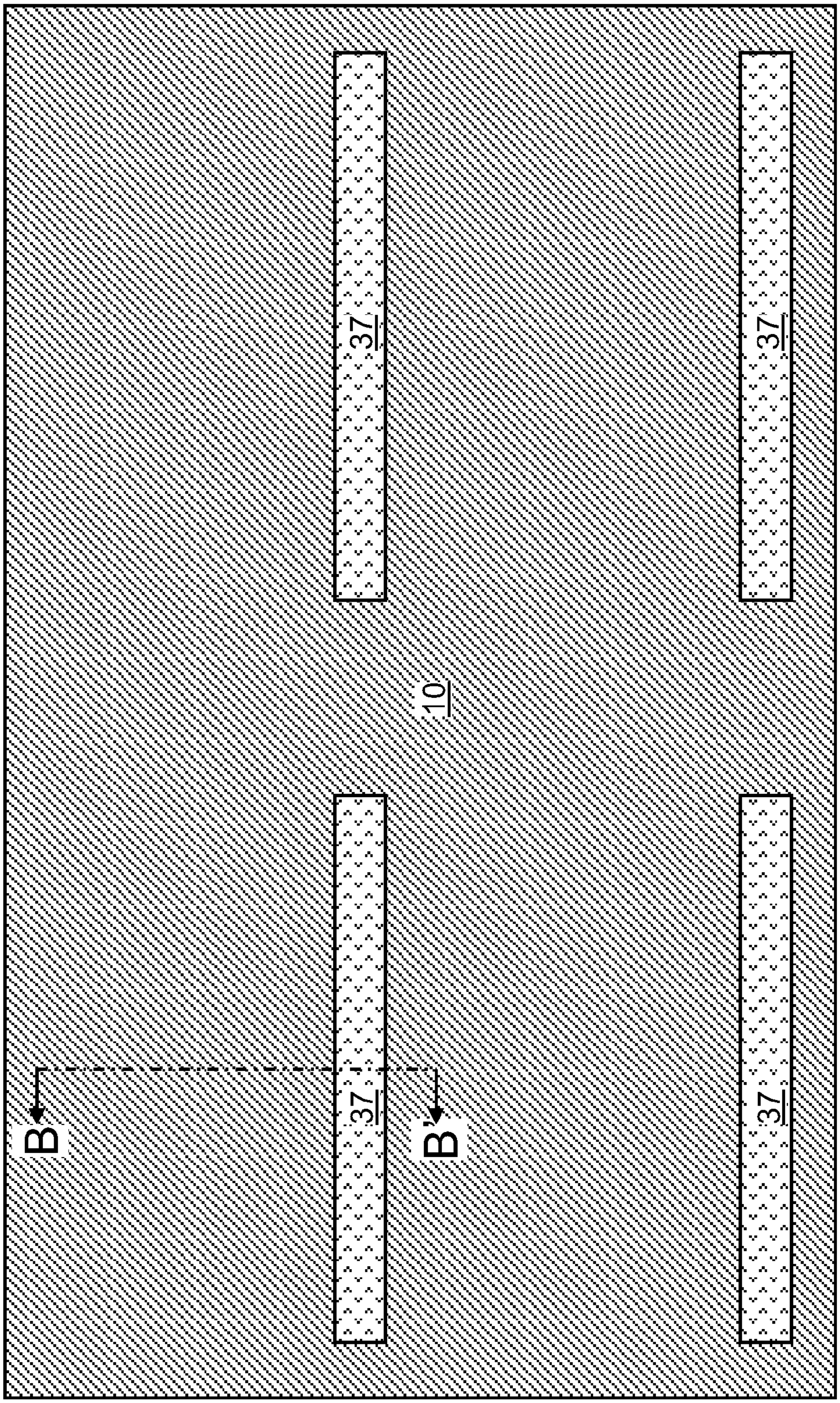
FIG. 2A is a top-down view of the first exemplary semiconductor structure after formation of semiconductor fins according to the first embodiment of the present disclosure.
Figure 2B:
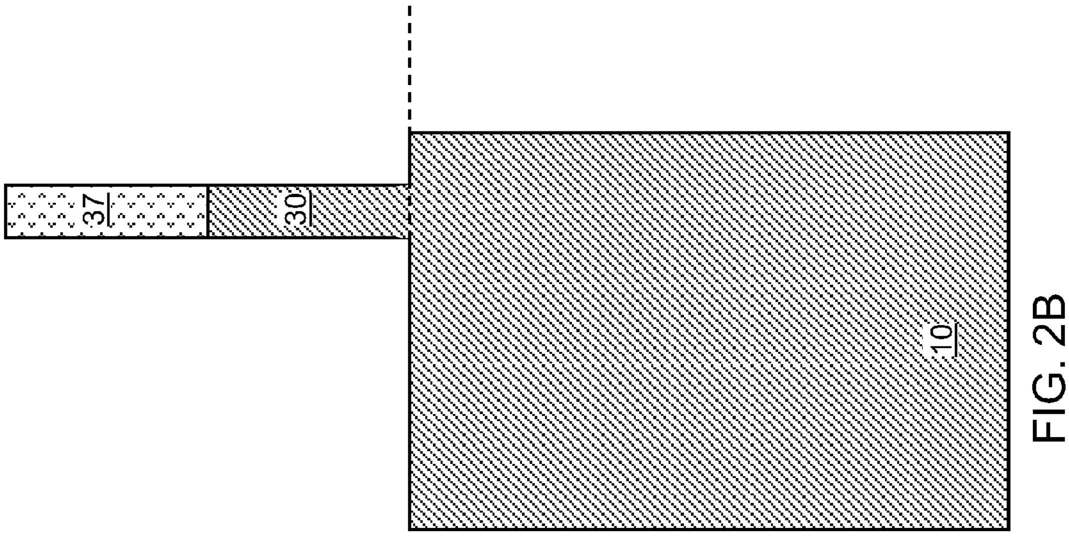
FIG. 2B is a vertical cross-sectional view of the first exemplary semiconductor structure along the vertical plane B-B' of FIG. 2A.

Referring to FIGS. 2A and 2B, an upper portion of the semiconductor substrate 10' can be patterned, by a combination of lithographic methods and an anisotropic etch, to form a plurality of semiconductor fins 30. For example, a photoresist layer 37 can be applied over the top surface of the semiconductor substrate 10' and lithographically patterned to mask portions of the semiconductor substrate 10' in which the plurality of semiconductor fins 30 is subsequently formed. The pattern in the photoresist layer 37 can be transferred into the upper portion of the semiconductor substrate 10' to form the plurality of semiconductor fins 30. The remaining portion of the semiconductor substrate 10' underlying the plurality of semiconductor fins 30 is herein referred to as a semiconductor material layer 10. The semiconductor material layer 10 functions as a substrate mechanically supporting the plurality of semiconductor fins 30. The plurality of semiconductor fins 30 and the semiconductor material layer 10 collectively constitute a contiguous semiconductor material portion. In one embodiment, the entirety of the contiguous semiconductor material portion can be single crystalline.

The height of the semiconductor fins 30 can be from 5 nm to 1,000 nm, although lesser and greater heights can also be employed. The plurality of semiconductor fins 30 and the semiconductor material layer 10 can be doped with electrical dopants, i.e., p-type dopants or n-type dopants, or can be intrinsic. In one embodiment, the entirety of the plurality of semiconductor fins 30 and the semiconductor material layer 10 can have a same type of doping, which is herein referred to as a first conductivity type.

As used herein, a "semiconductor fin" refers to a semiconductor material portion having a pair of parallel vertical sidewalls that are laterally spaced by a uniform dimension. In one embodiment, each semiconductor fin can have a rectangular horizontal cross-sectional area such that the spacing between the pair of parallel vertical sidewalls is the same as the length of shorter sides of the shape of the rectangular horizontal cross-sectional area. As used herein, a "fin field effect transistor" refers to a field effect transistor in which at least a channel region is located within a semiconductor fin.

Each semiconductor fin 30 is laterally bound by a pair of lengthwise sidewalls and a pair of widthwise sidewalls. As used herein, a "lengthwise direction" of an element refers to a direction about which the moment of inertia of the element becomes a minimum. As used herein, a "lengthwise sidewall" of an element refers to a sidewall of an element that extends along the lengthwise direction of the element. As used herein, a "widthwise sidewall" of an element refers to a sidewall of the element that extends along a horizontal direction that is perpendicular to the lengthwise direction of the element. In one embodiment, each of the plurality of semiconductor fins 30 can have a rectangular horizontal cross-sectional shape.

Figure 3A:
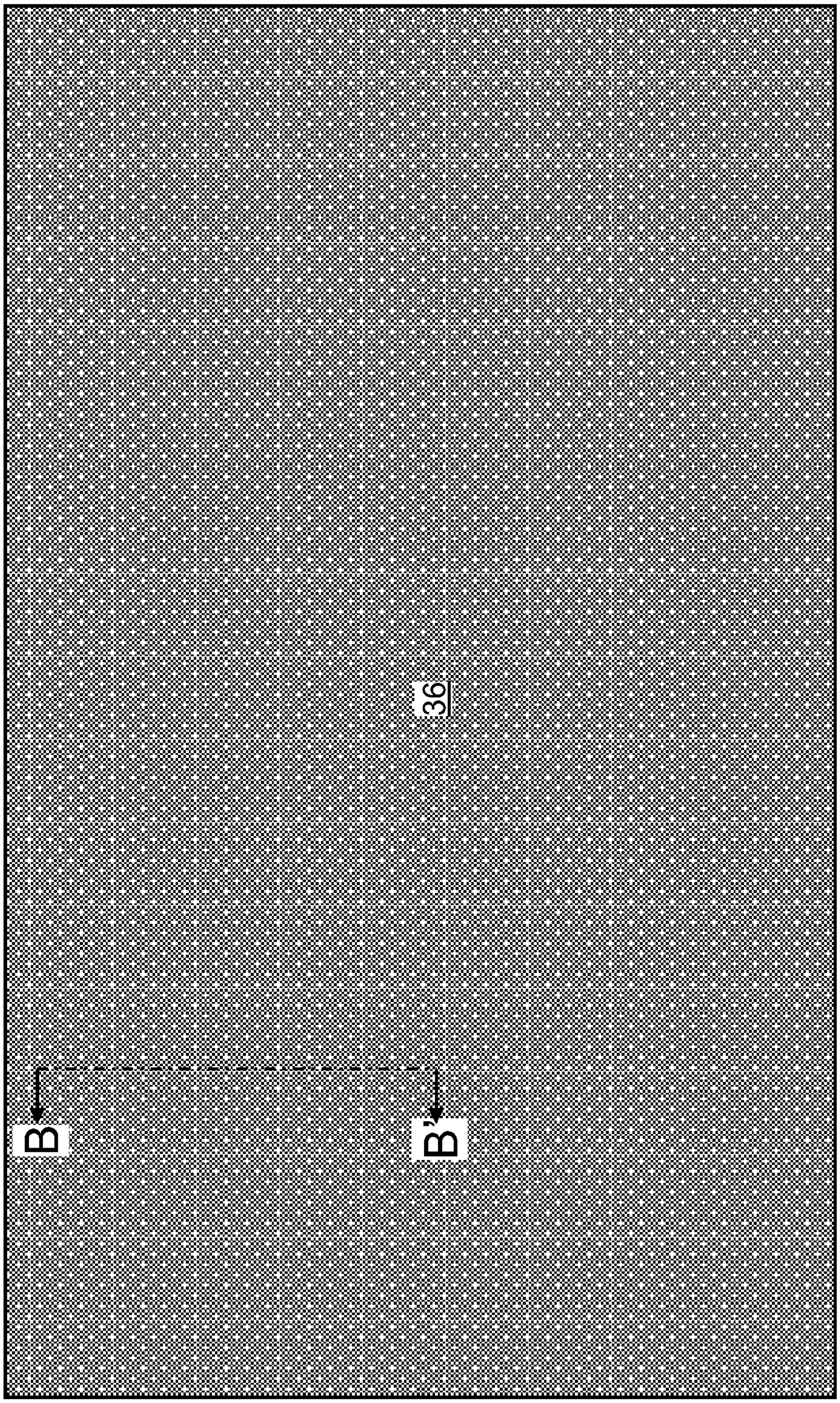
FIG. 3A is a top-down view of the first exemplary semiconductor structure after formation of a shallow trench isolation structure layer and a hard mask layer according to the first embodiment of the present disclosure.
Figure 3B:
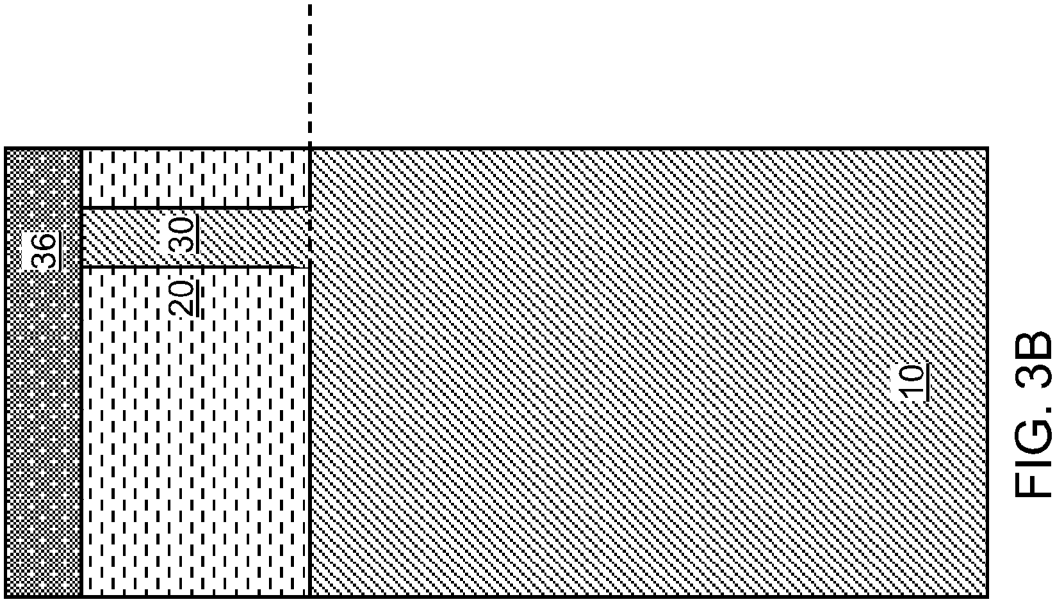
FIG. 3B is a vertical cross-sectional view of the first exemplary semiconductor structure along the vertical plane B-B' of FIG. 3A.

In one embodiment, lengthwise sidewalls of multiple semiconductor fins 30 within a same row can be within a pair of vertical planes laterally spaced from each other by the width of a semiconductor fin 30. In one embodiment, widthwise sidewalls of multiple semiconductors within a same column can be within a pair of vertical planes laterally spaced from each other by the length of a semiconductor fin 30. In one embodiment, the plurality of semiconductor fins 30 can be within a two-dimensional array having a first pitch along the lengthwise direction of the semiconductor fins 30 and a second pitch along the lengthwise direction of the semiconductor fins Referring to FIGS. 3A and 3B, a shallow trench isolation layer 20 is formed among the plurality of semiconductor fins 30. The shallow trench isolation layer 20 includes a dielectric material such as silicon oxide. The shallow trench isolation layer 20 can be formed by depositing a dielectric material over the semiconductor fins 30 and the semiconductor material layer 10. The deposition of the dielectric material can be performed, for example, by chemical vapor deposition or spin coating. Excess portions of the deposited dielectric material can be removed from above the top surfaces of the semiconductor fins 30, for example, by planarization (such as chemical mechanical planarization (CMP)). The shallow trench isolation layer 30 laterally surrounds the plurality of semiconductor fins 30. The top surface of the shallow trench isolation layer 30 can be coplanar with the top surfaces of the plurality of semiconductor fins 30.

A hard mask layer 36 can be deposited over the shallow trench isolation layer 20, for example, by chemical vapor deposition (CVD). The hard mask layer 36 can include one or more layers that can be employed as an etch mask for forming trenches 11 in the semiconductor material layer 10. In one embodiment, the hard mask layer 36 can include a dielectric material such as a doped or undoped silicon oxide, silicon nitride, a dielectric metal nitride, or a dielectric metal oxide.

The thickness of the hard mask layer 36 can be from 100 nm to 2,000 nm, although lesser and greater thicknesses can also be employed.

Figure 4A:
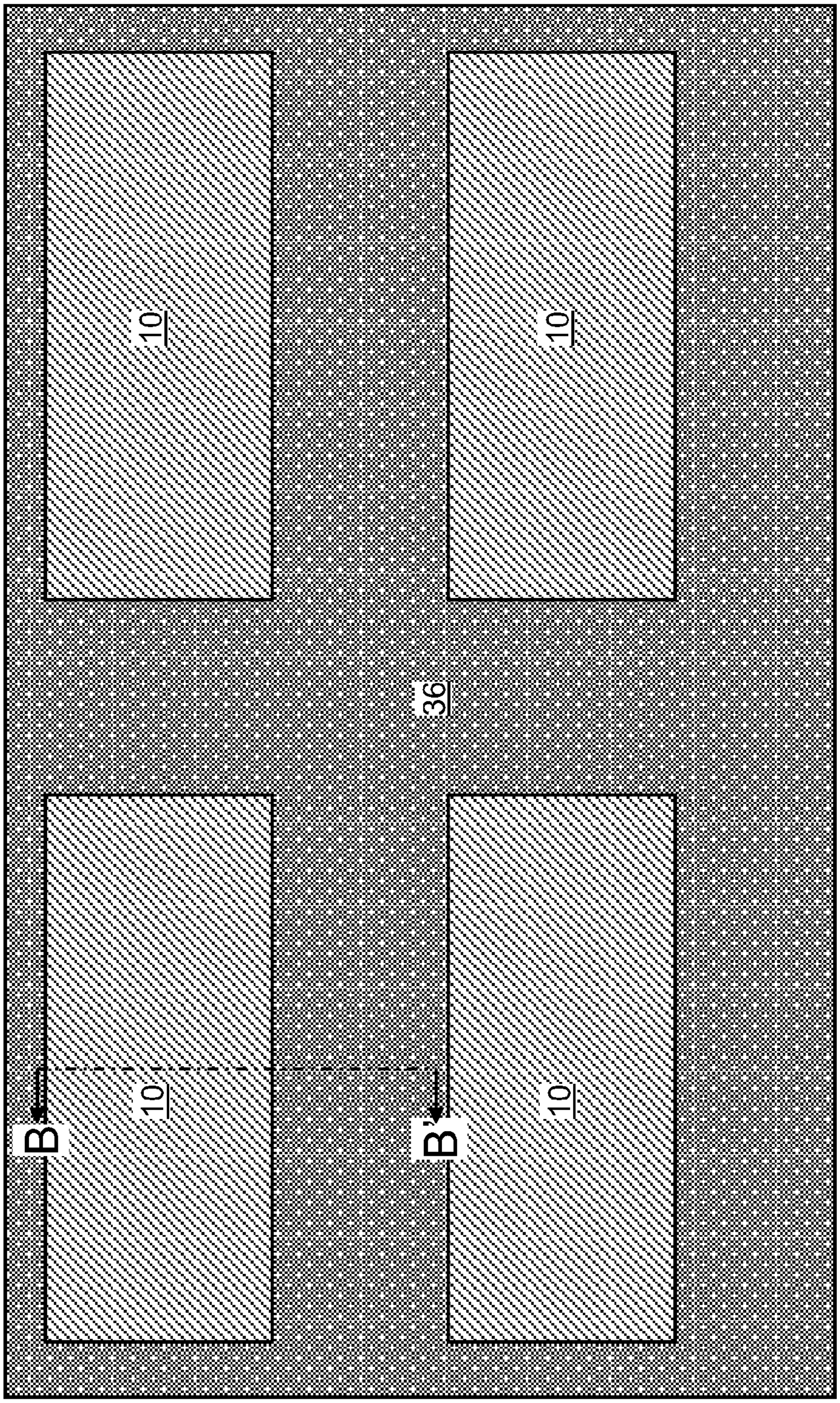
FIG. 4A is a top-down view of the first exemplary semiconductor structure after formation of trenches according to the first embodiment of the present disclosure.
Figure 4B:
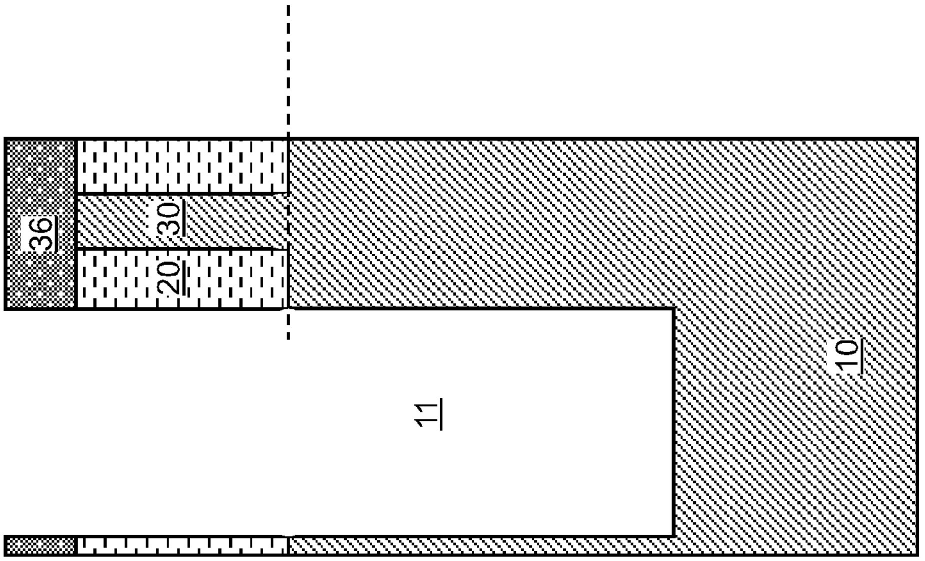
FIG. 4B is a vertical cross-sectional view of the first exemplary semiconductor structure along the vertical plane B-B' of FIG. 4A.

Referring to FIGS. 4A and 4B, a photoresist layer (not shown) can be applied over the hard mask layer 36, and can be lithographically patterned to form openings corresponding to the areas of trenches 11 to be subsequently formed. The pattern in the photoresist layer can be transferred into the hard mask layer 36. Subsequently, the pattern in the hard mask layer 36 can be transferred through the shallow trench isolation layer 20 and an upper portion of the semiconductor material layer 10 by an anisotropic etch that employs the hard mask layer 36 as an etch mask. A trench 11 can be formed for each opening in the hard mask layer 36. The photoresist can be removed by ashing, or can be consumed during the etch process that forms the trenches 11.

In one embodiment, the locations of the openings in the photoresist layer and the hard mask layer 36 can be selected such that entire periphery of each trench 11 can be formed between a first vertical plane including a proximal lengthwise sidewall of a first semiconductor fin 30 within a neighboring pair of the semiconductor fins 30 and a second vertical plane including a proximal lengthwise sidewall of a second semiconductor fin within the neighboring pair of the semiconductor fins 30. Within the neighboring pair of the semiconductor fins 30, the first semiconductor fin and the second semiconductor fin are laterally spaced from each other by the widthwise direction of the semiconductor fins 30, i.e., along the horizontal direction perpendicular to the lengthwise direction of each semiconductor fin 30. Further, the entire periphery of each trench 11 can be formed between a pair of vertical planes including two widthwise sidewalls of the first semiconductor fin, which can also include two widthwise sidewalls of the second semiconductor fin.

The sidewalls of each trench 11 can be substantially vertically coincident among the various layers (36, 20, 10) through which the trench 11 extends. As used herein, sidewalls of multiple elements are "vertically coincident" if the sidewalls of the multiple elements overlap in a top-down view. As used herein, sidewalls of multiple elements are "substantially vertically coincident" if the lateral offset of the sidewalls of the multiple elements from a perfectly vertical surface is within three times the root mean square of surface roughness of sidewalls of each element.

The depth of each trench 11 as measured from the plane of the topmost surface of the semiconductor fins 30 to the bottom surface of the trench 11 can be from 500 nm to 10 microns, although lesser and greater depths can also be employed. In one embodiment, the trenches 11 can be deep trenches. As used herein, a "deep trench" refers to a trench that having a depth greater than 2.0 microns, which is the maximum depth for ion implantation as known in the art. The lateral dimensions of each trench 11 can be limited by the lithographic capabilities, i.e., the ability of a lithographic tool to print the image of an opening on the photoresist layer.

Figure 5A:
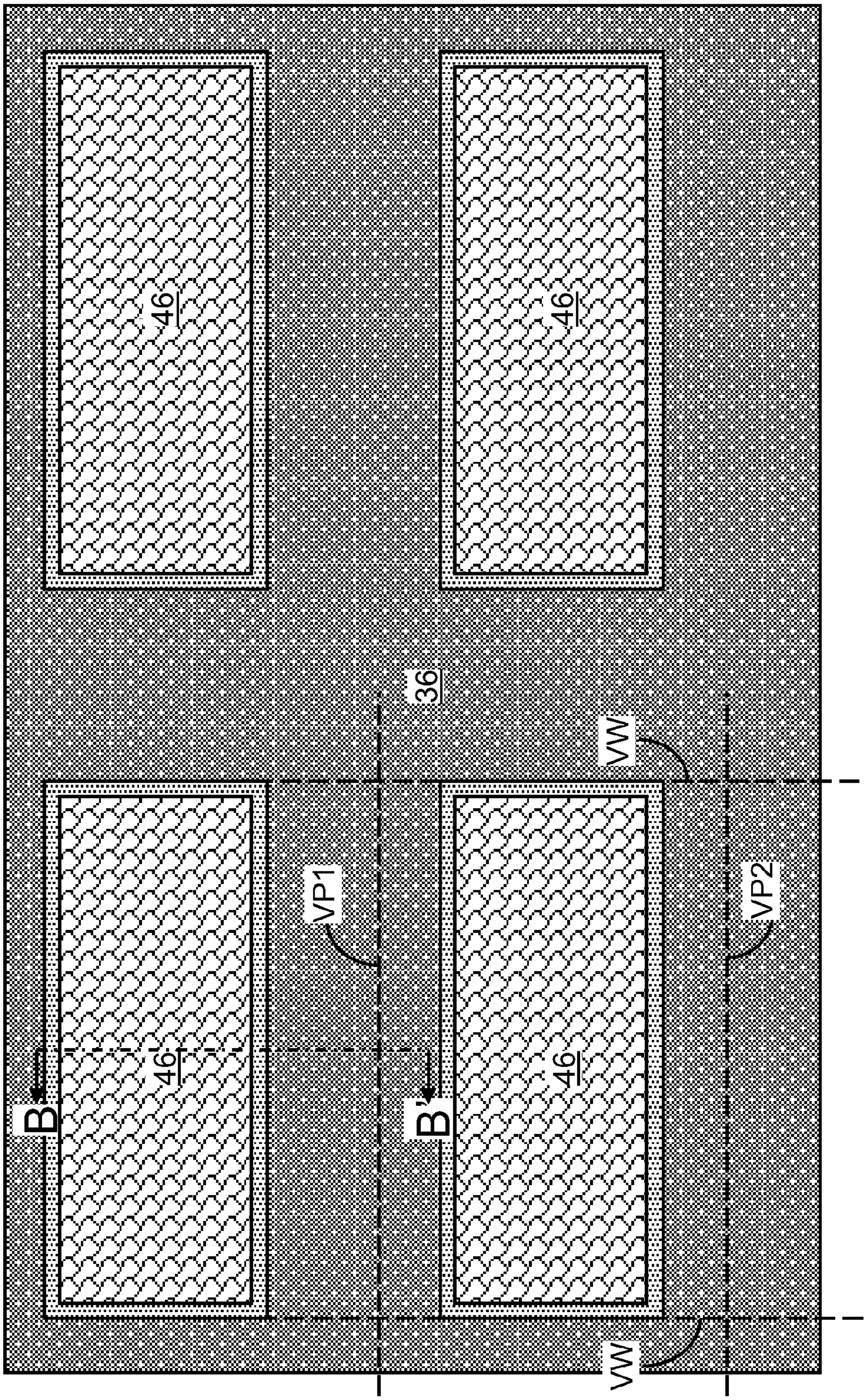
FIG. 5A is a top-down view of the first exemplary semiconductor structure after formation of trench capacitors according to the first embodiment of the present disclosure.
Figure 5B:
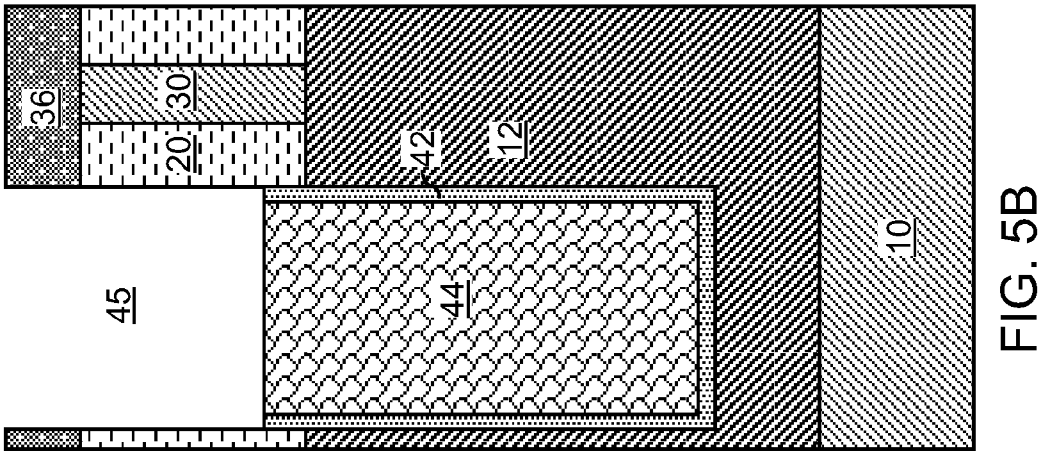
FIG. 5B is a vertical cross-sectional view of the first exemplary semiconductor structure along the vertical plane B-B' of FIG. 5A.

Referring to FIGS. 5A and 5B, a buried plate 12 can be formed by doping a portion of the semiconductor material layer 10 in proximity of sidewalls of each trench 11. Dopants can be introduced, for example, by outdiffusion from a dopant-including disposable material (such as a doped silicate glass) or by ion implantation as known in the art. Further, any other method of forming a buried plate 12 in the semiconductor material layer 10 of the semiconductor material layer 10 can be employed in lieu of outdiffusion from a dopant-including disposable material or ion implantation.

In one embodiment, the buried plate 12 can be doped with dopants of a second conductivity type which is the opposite of the first conductivity type. For example, the first conductivity type can be p-type and the second conductivity type can be n-type, or vice versa. A p-n junction is formed between the remaining portion of the semiconductor material layer 10 and the buried plate 12. The dopant concentration in the buried plate 12 can be, for example, from $1.0\times10^{18}/cm^3$ to $2.0\times10^{21}/cm^3$, and typically from $5.0\times10^{18}/cm^3$ to $5.0\times10^{19}/cm^3$, although lesser and greater dopant concentrations can also be employed.

A node dielectric 42 can be deposited conformally on all physically exposed sidewalls in each trench 11 and on the top surface of the hard mask layer 36. The node dielectric 42 can include any dielectric material that can be employed as a node dielectric material in a capacitor known in the art. For example, the node dielectric 42 can include at least one of silicon nitride and/or a dielectric metal oxide material such as high dielectric constant (high-k) gate dielectric material as known in the art.

A conductive material can be deposited to completely fill each trench 11. The conductive material can be a metallic material or a doped semiconductor material. The metallic material can be an elemental metal such as W, Ti, Ta, Cu, or Al, or an alloy of at least two elemental metals, or a conductive metallic nitride of at least one metal, or a conductive metallic oxide of at least one metal. The doped semiconductor material can be a doped elemental semiconductor material, a doped compound semiconductor material, or an alloy thereof. The conductive material can be deposited by physical vapor deposition (PVD), chemical vapor deposition (CVD), electroplating, electroless plating, or a combination thereof. The conductive material is deposited to a thickness that is sufficient to fill each trench 11 completely.

Excess portions of the conductive material can be removed from above the top surface of the hard mask layer 36, for example, by chemical mechanical planarization. Subsequently, the conductive material can be vertically recessed to a level between the top surface of the shallow trench isolation layer 20 and the bottom surface of the shallow trench isolation layer 20 by a recess etch. The recess etch of the conductive material layer can employ an anisotropic etch such as a reactive ion etch, an isotropic etch such as a wet etch, or a combination thereof. The recess etch can be selective to the material of the node dielectric 42.

An inner electrode 44 including the conductive material is formed in each trench 11. The topmost surface of the inner electrode 44 is substantially planar, and is located between the level of the top surface of the shallow trench isolation layer 20 and the level of the bottom surface of the shallow trench isolation layer 20. A surface is substantially planar if the planarity of the surface is limited by microscopic variations in surface height that accompanies semiconductor processing steps known in the art. A cavity 45 is formed above the inner electrode 44.

The physically exposed portions of the node dielectrics 42 can be patterned by an etch, which can be a wet etch. For example, if the node dielectrics 42 include silicon nitride, the physically exposed portions of the node dielectric 42 can be removed by a wet etch employing hot phosphoric acid. Each remaining portion of the node dielectric 42 within each trench 11 constitutes a node dielectric 42. Each adjoined set of a buried plate 12, a node dielectric 42, and an inner electrode 44 constitute a trench capacitor (12, 42, 44). Each buried plate 12 is an outer node of the trench capacitor, the node dielectric 42 is the dielectric separating the outer electrode from the inner electrode, and the inner electrode 44 is the inner electrode of the trench capacitor. The trench capacitor is embedded within the combination of the semiconductor material layer 10 and the shallow trench isolation layer 20. The shallow trench isolation layer 20 overlies the buried plate 12 (i.e., the outer electrode).

The entirety of each node dielectric 42 can be formed within the substrate including the semiconductor material layer 10, the buried plates 12, and the shallow trench isolation layer 20. The entirety of each node dielectric 42 can be formed between a first vertical plane VP1 including a proximal lengthwise sidewall of a first semiconductor fin within a neighboring pair of semiconductor fins 30 and a second vertical plane VP2 including a proximal lengthwise sidewall of a second semiconductor fin within the neighboring pair of the semiconductor fins 30. The semiconductor fins in the neighboring pair of semiconductor fins 30 are laterally separated from each other along a direction perpendicular to the lengthwise direction of the semiconductor fins 30. Further, the entirety of each node dielectric 42 can be formed between a pair of vertical planes VW including two widthwise sidewalls of the first semiconductor fin. In one embodiment, the pair of vertical planes including the two widthwise sidewalls of the first semiconductor fin can also include two widthwise sidewalls of the second semiconductor fin.

Figure 6A:
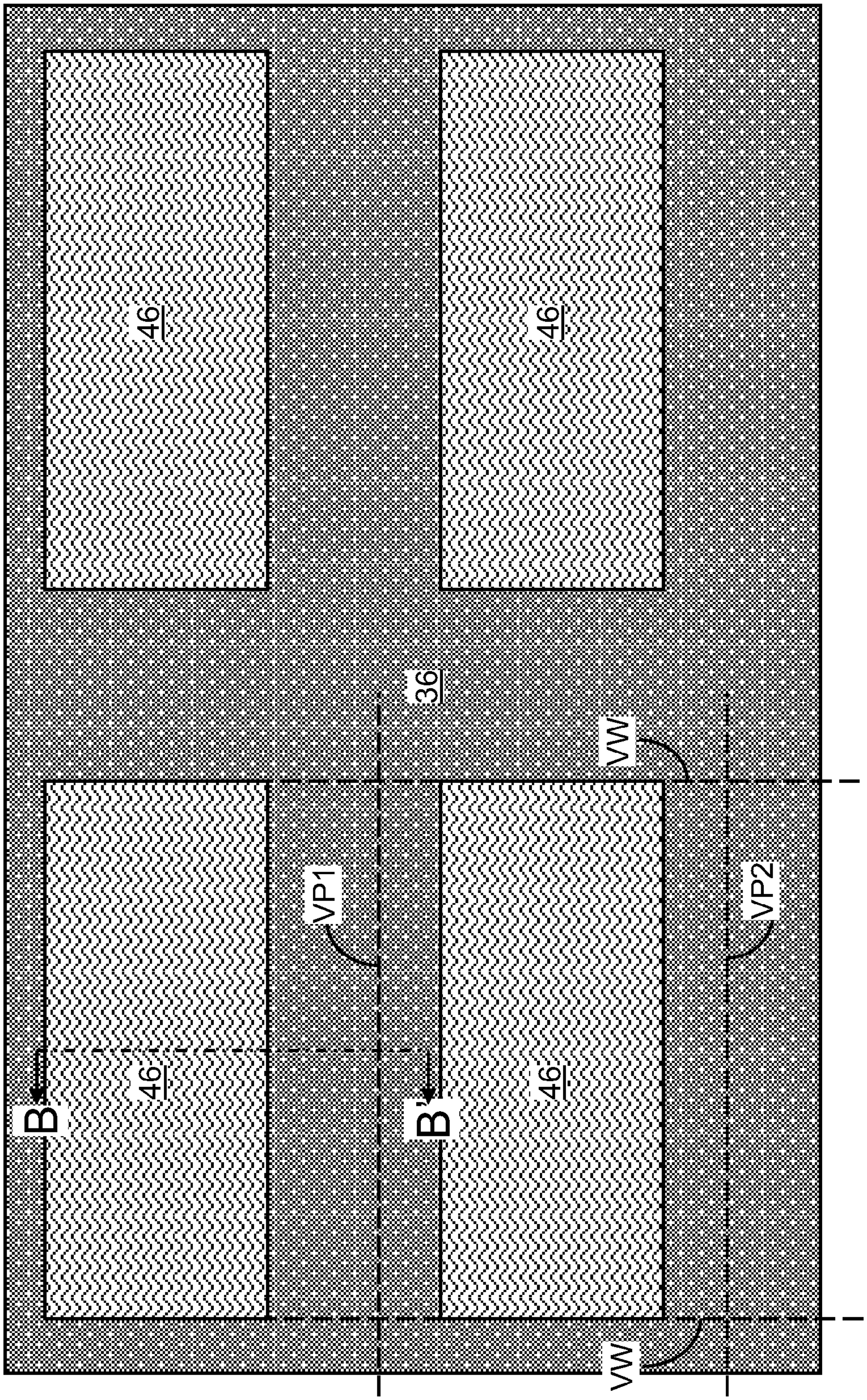
FIG. 6A is a top-down view of the first exemplary semiconductor structure after formation of trench top dielectric portions according to the first embodiment of the present disclosure.
Figure 6B:
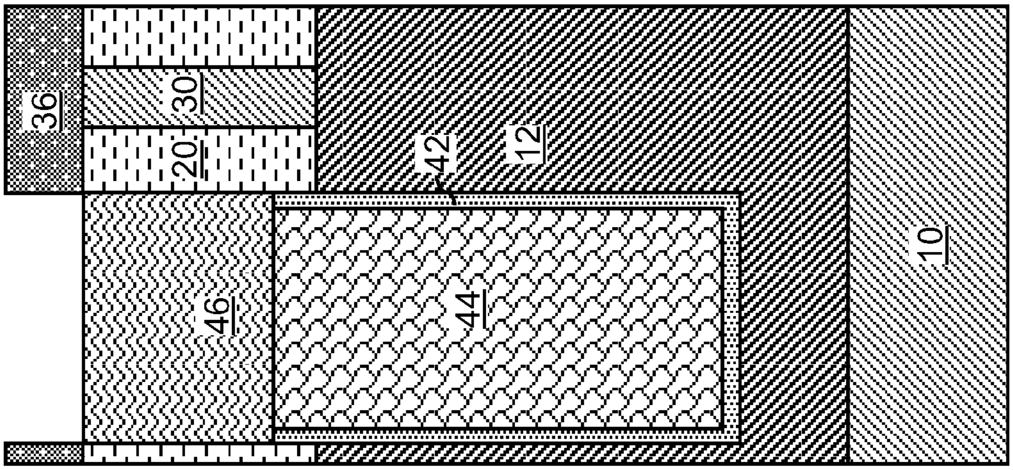
FIG. 6B is a vertical cross-sectional view of the first exemplary semiconductor structure along the vertical plane B-B' of FIG. 6A.

Referring to FIGS. 6A and 6B, a dielectric material can be deposited within the cavity 45, and can be subsequently planarized employing the hard mask layer 36 as a stopping layer to remove excess portions of the deposited dielectric material from above the top surface of the hard mask layer 36. The remaining portion of the deposited dielectric material can be recessed relative to the top surface of the hard mask layer 36 by a recess etch to a height about the top surface of the shallow trench isolation layer 20 to form a trench top dielectric portion 46 within each trench. The dielectric material of the trench top dielectric portion 46 can be different from the dielectric material of the hard mask layer 36. For example, the dielectric material of the hard mask layer 36 can be silicon nitride, and dielectric material of the trench top dielectric portion 46 can be silicon oxide. The dielectric material of the trench top dielectric portion 46 can be deposited, for example, by chemical vapor deposition (CVD).

Each trench top dielectric portion 46 can be formed in a region laterally bounded by the first vertical plane VP1 including the proximal lengthwise sidewall of the first semiconductor fin within a neighboring pair of semiconductor fins 30 and a second vertical plane VP2 including the proximal lengthwise sidewall of a second semiconductor fin within the neighboring pair of the semiconductor fins 30. Further, the entirety of each trench top dielectric portion 46 can be formed between the pair of vertical planes VW including two widthwise sidewalls of a semiconductor fin 30.

Figure 7A:
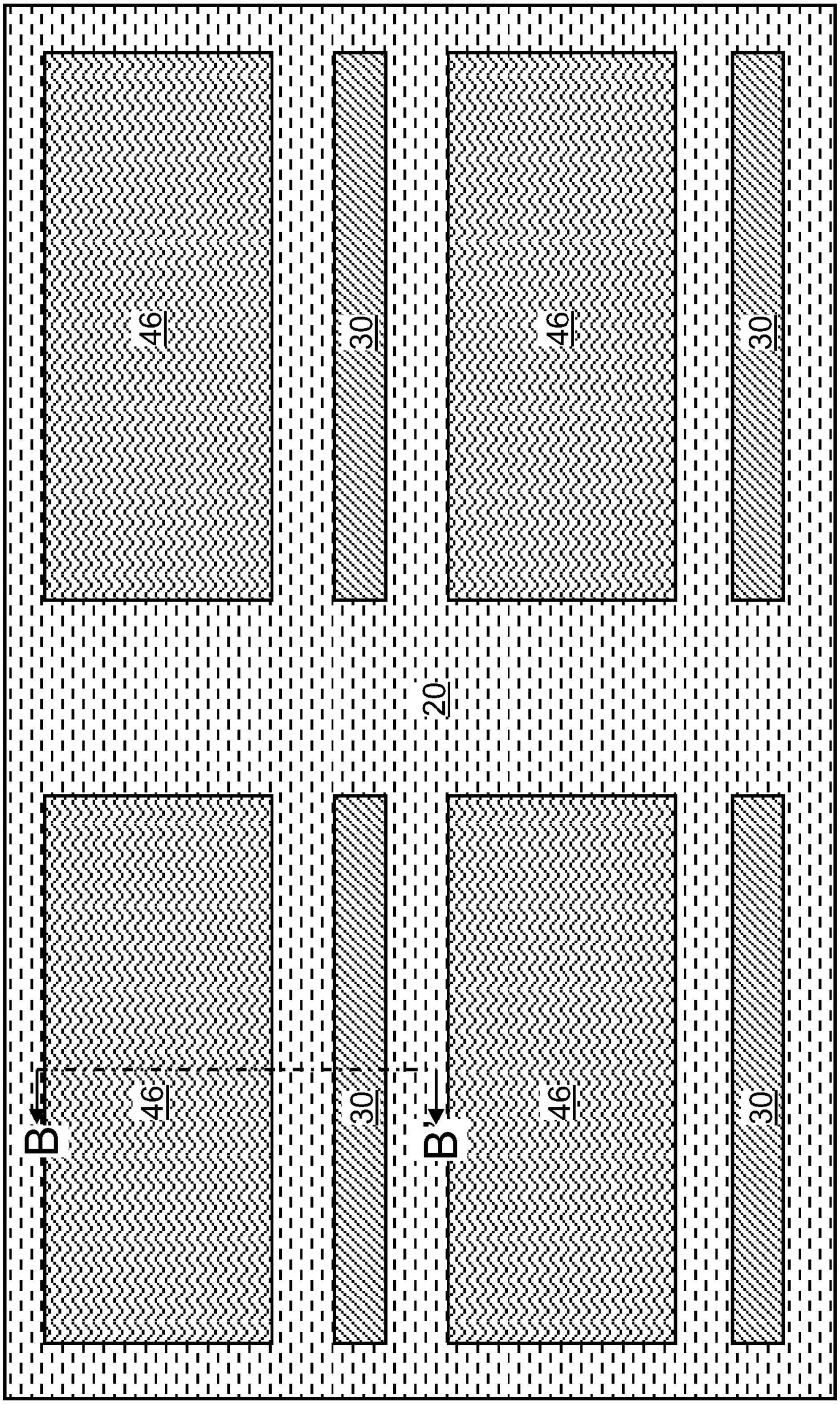
FIG. 7A is a top-down view of the first exemplary semiconductor structure after removal of the hard mask layer and recessing of the shallow trench isolation layer and the trench top dielectric portions according to the first embodiment of the present disclosure.
Figure 7B:
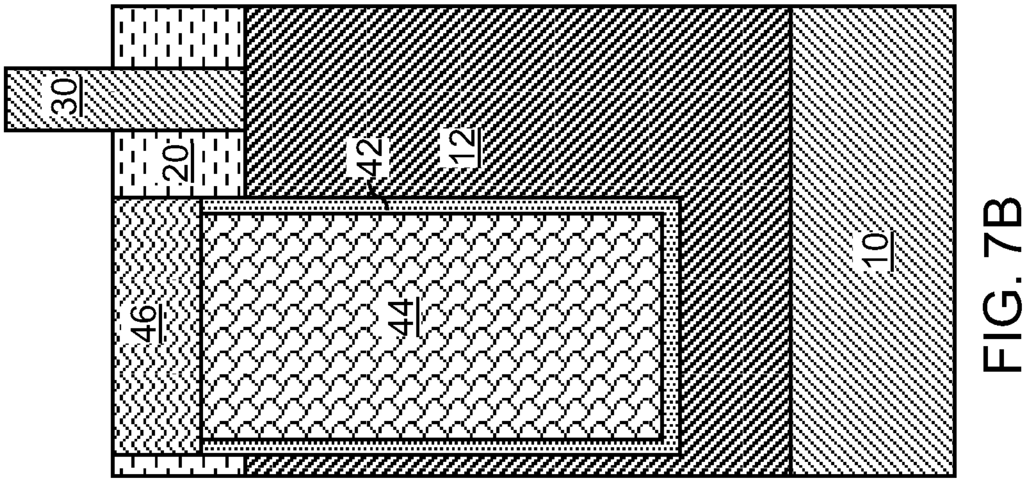
FIG. 7B is a vertical cross-sectional view of the first exemplary semiconductor structure along the vertical plane B-B' of FIG. 7A.

Referring to FIGS. 7A and 7BB, the hard mask layer 36 can be removed, for example, by a wet etch selective to the trench top dielectric portion 46 and the shallow trench isolation layer 20. In one embodiment, the hard mask layer 36 can include silicon nitride, the trench top dielectric portion 46 and the shallow trench isolation layer 20 include silicon oxide, and the removal of the hard mask layer 36 selective to the trench top dielectric portion 46 and the shallow trench isolation layer 20 can be effected by a wet etch employing hot phosphoric acid.

The shallow trench isolation layer 20 and the trench top dielectric portions 46 are recessed relative to the top surfaces of the semiconductor fins 30. An etch process that is selective to the semiconductor material of the semiconductor fins 30 can be employed to recess the shallow trench isolation layer 20 and the trench top dielectric portions 46. For example, if the shallow trench isolation layer 20 and the trench top dielectric portion 46 include silicon oxide, a wet etch employing hydrofluoric acid can be employed to recess the shallow trench isolation layer 20 and the trench top dielectric portions 46. Surfaces of an upper portion of each semiconductor fin 30 are physically exposed.

Figure 8A:
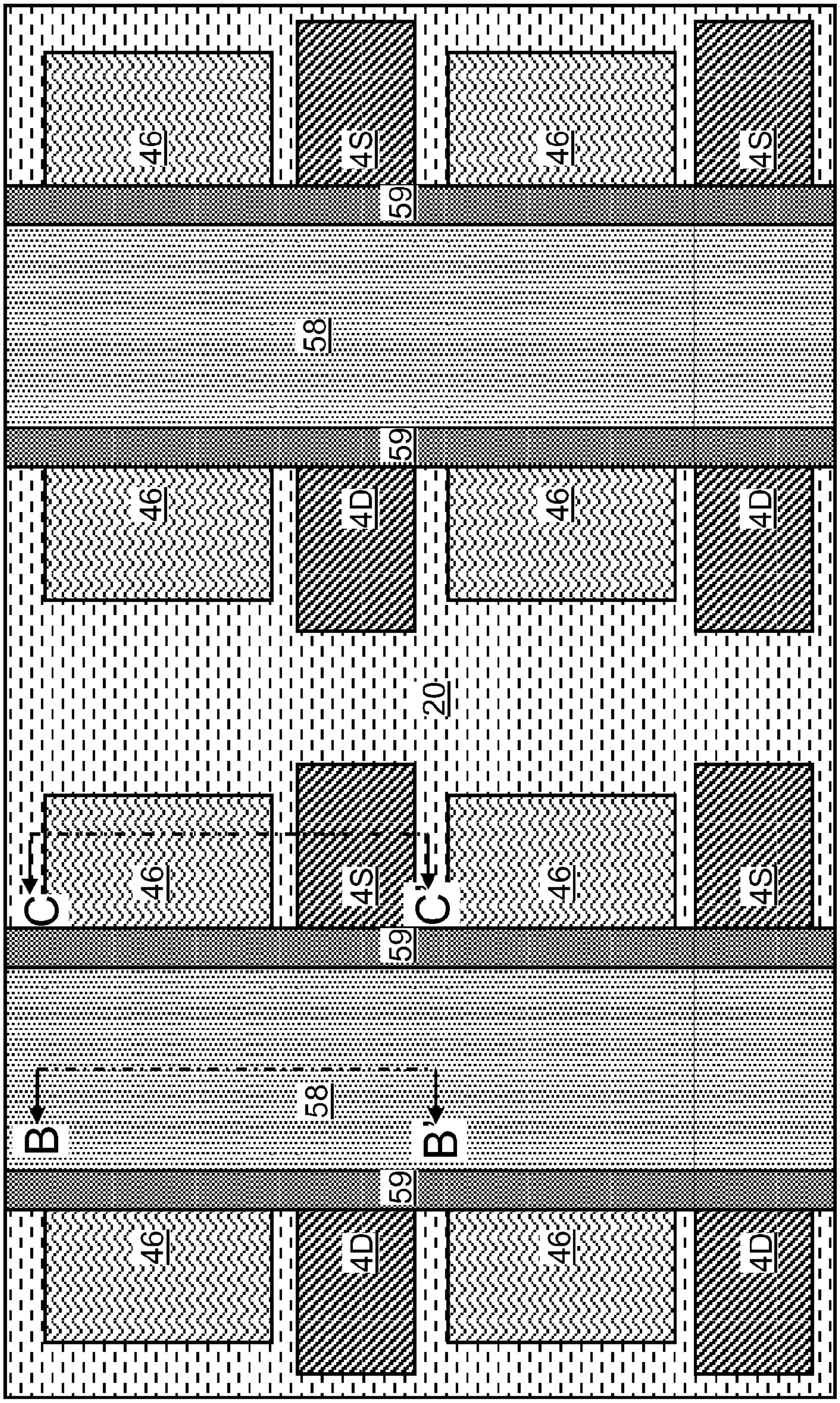
FIG. 8A is a top-down view of the first exemplary semiconductor structure after formation of gate structures, source regions, drain regions, gate spacers, raised source regions, and raised drain regions according to the first embodiment of the present disclosure.
Figure 8C:
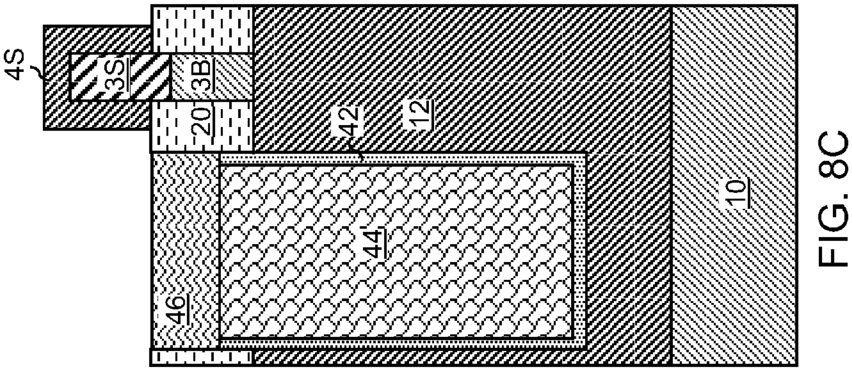
FIG. 8C is a vertical cross-sectional view of the first exemplary semiconductor structure along the vertical plane C-C' of FIG. 8A.
Figure 8B:
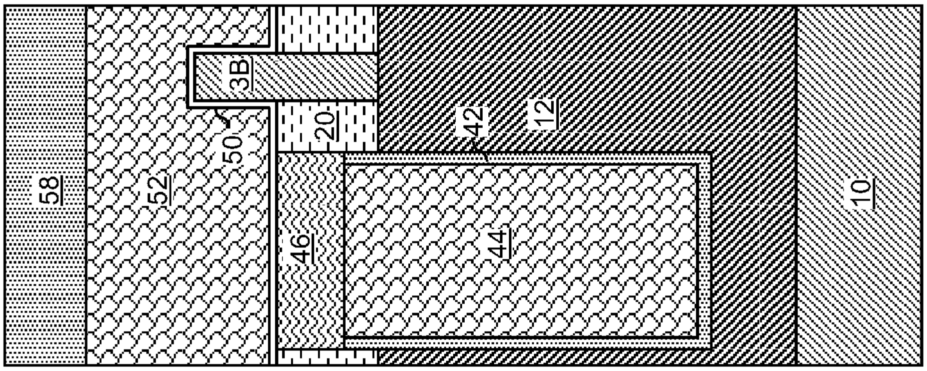
FIG. 8B is a vertical cross-sectional view of the first exemplary semiconductor structure along the vertical plane B-B' of FIG. 8A.

Referring to FIGS. 8A, 8B, and 8C, a stack of gate level layers can be deposited and lithographically patterned to form gate structures (50, 52, 58). The gate level layers can include, for example, a gate dielectric layer, a gate material layer, and a gate cap layer. The gate dielectric layer can be a disposable dielectric material that is removed in field effect transistors to be formed, or can include a non-disposable dielectric material that remains permanently in field effect transistors to be formed. The gate material layer can include a disposable material that is removed in field effect transistors to be formed, or can include a non-disposable conductive material that remains permanently in field effect transistors to be formed. The gate cap layer includes a dielectric material such as silicon nitride or a dielectric nitride.

The gate dielectric layer can be formed by conversion of surface portions of a semiconductor material (e.g., the semiconductor material of the semiconductor fins 30; See FIGS. 7A and 7B), deposition of a dielectric material, or a combination thereof. The gate dielectric layer can include a dielectric semiconductor-containing compound (e.g., silicon oxide, silicon nitride, and/or silicon oxynitride) and/or a dielectric metal compound (e.g., dielectric metal oxide, dielectric metal nitride, and/or dielectric metal oxynitride).

If the gate fill layer includes a non-disposable conductive material, the gate material layer can include a doped semiconductor material and/or a metallic material. The gate fill layer can optionally include a work function metal layer that tunes the threshold voltage of the access transistor to be formed.

The gate level layers can be patterned by a combination of lithography and etch to form the gate structures (50, 52, 58). The gate structures (50, 52, 58) straddle the portions of the semiconductor fins 30 that become body regions of field effect transistors.

Each remaining portion of the gate dielectric layer within a gate structure (50, 52, 58) constitutes a gate dielectric 50. Each remaining portion of the gate fill layer within a gate structure (50, 52, 58) constitutes a gate fill structure 52. Each remaining portion of the gate cap layer within a gate structure (50, 52, 58) constitutes a gate cap dielectric 58.

Portions of the semiconductor fins 30 that underlie the gate structures (50, 52, 58) correspond to the body regions of access field effect transistors to be subsequently formed for the trench capacitors (12, 42, 44). The gate structures (50, 52, 58) can extend along the general direction of the widthwise direction of the plurality of semiconductor fins 30. While the present disclosure is described employing gate structures (50, 52, 58) extending along the direction perpendicular to the lengthwise direction of the semiconductor fins 30, embodiments in which wiggles are introduced within the gate structures (50, 52, 58) are expressly contemplated herein.

In one embodiment, the gate structures (50, 52, 58) are disposable gate structures that are subsequently replaced with other gate structures, which are herein referred to as replacement gate structures. In this case, the disposable gate structures include disposable materials, which are herein referred to as disposable gate materials, i.e., disposable materials formed within gate-level structures.

In one embodiment, the gate structures (50, 52, 58) are permanent gate structures that are present in field effect transistors and function as a combination of a gate dielectric and a gate electrode. In this case, the gate dielectric can include any gate dielectric material that can be employed in gate-first integration schemes, i.e., non-replacement gate integration schemes. Each gate fill structure 52 includes a conductive material and constitutes a gate electrode that is functional, i.e., capable of turning on or off field effect transistors.

Source regions 3S and drain regions 3D can be formed by implanting dopants of the opposite conductivity type of the first conductivity type. The gate structures (50, 52, 58) and the dummy gate structures (51, 53, 59) can be employed as mask structures during the ion implantation that forms the source regions 3S and the drain regions 3D. Unimplanted portions of the semiconductor fins 30 constitute body regions 3B.

Gate spacers 56 can be formed by depositing a conformal dielectric layer and anisotropically etching the conformal dielectric layer. In one embodiment, the conformal dielectric layer can include a dielectric material different from the dielectric material of the shallow trench isolation layer 20. For example, the conformal dielectric layer can include silicon nitride. The etch process that removes horizontal portions of the conformal dielectric layer can be prolonged after horizontal portions of the conformal dielectric layer are removed so that vertical portions of the conformal dielectric layer on sidewalls of the semiconductor fins (3S, 3D, 3B) are removed. Each remaining portion of the conformal dielectric layer around a gate structure (50, 52, 58) is a gate spacer 56. Each gate spacer 56 laterally surrounds a gate structure (50, 52, 58).

Optionally, dopants of the second conductivity type can be implanted into the source regions 3S and the drain regions 3D of the semiconductor fins (3S, 3D, 3B) employing the combination of the gate structures (50, 52, 58) and the gate spacers 56 as an implantation mask.

Optionally, a selective epitaxy process can be performed to deposit a semiconductor material on physically exposed semiconductor surfaces. A raised source region 4S can be formed directly on each source region 3S, and a raised drain region 4D can be formed directly on each drain region 3D. Each raised source region 4S is epitaxially aligned to an underlying source region 3S. Each raised drain region 4D is epitaxially aligned to an underlying drain region 3D. The lateral extent of the raised source regions 4S and the raised drain regions 4D is controlled to avoid electrical shorts thereamongst. The outer sidewalls surfaces of the raised source regions 4S and the raised drain regions 4D may contact the shallow trench isolation layer 20 only, or may contact top surfaces of the trench top dielectric portions 46, depending on the thickness of the raised source regions 4S and the raised drain region 4D.

Figure 9A:
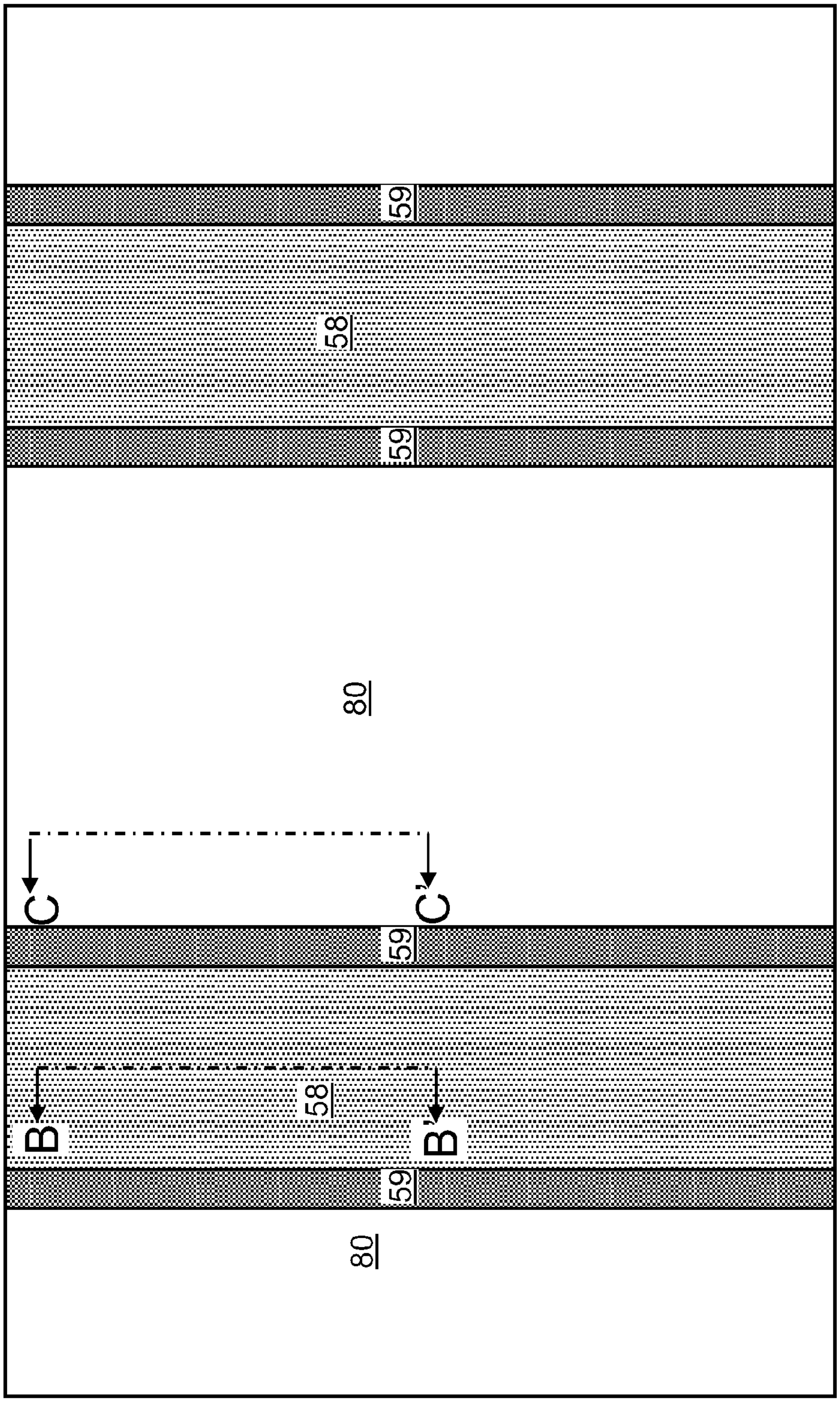
FIG. 9A is a top-down view of the first exemplary semiconductor structure after formation of a planarization dielectric layer according to the first embodiment of the present disclosure.
Figure 9C:
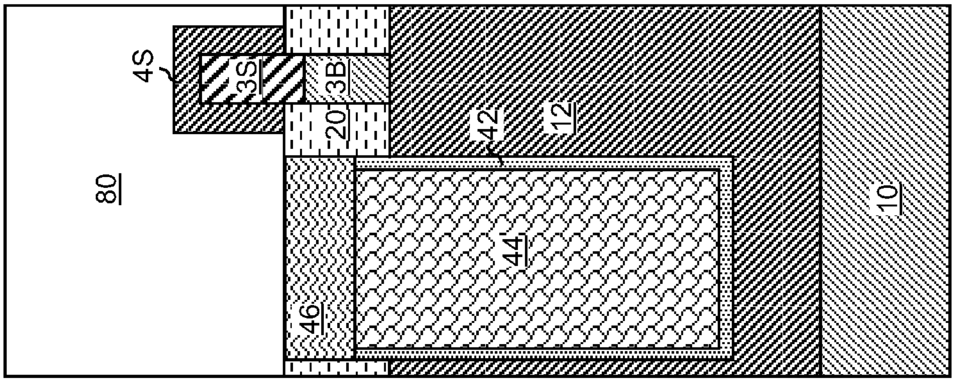
FIG. 9C is a vertical cross-sectional view of the first exemplary semiconductor structure along the vertical plane C-C' of FIG. 9A.
Figure 9B:
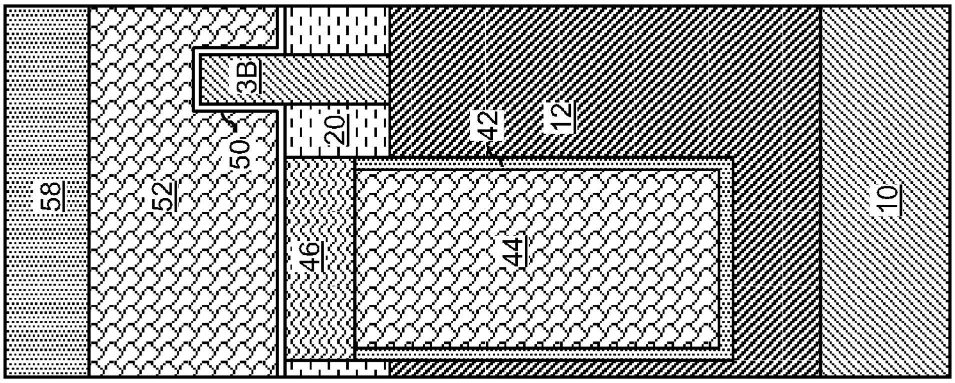
FIG. 9B is a vertical cross-sectional view of the first exemplary semiconductor structure along the vertical plane B-B' of FIG. 9A.
Figure 10A:
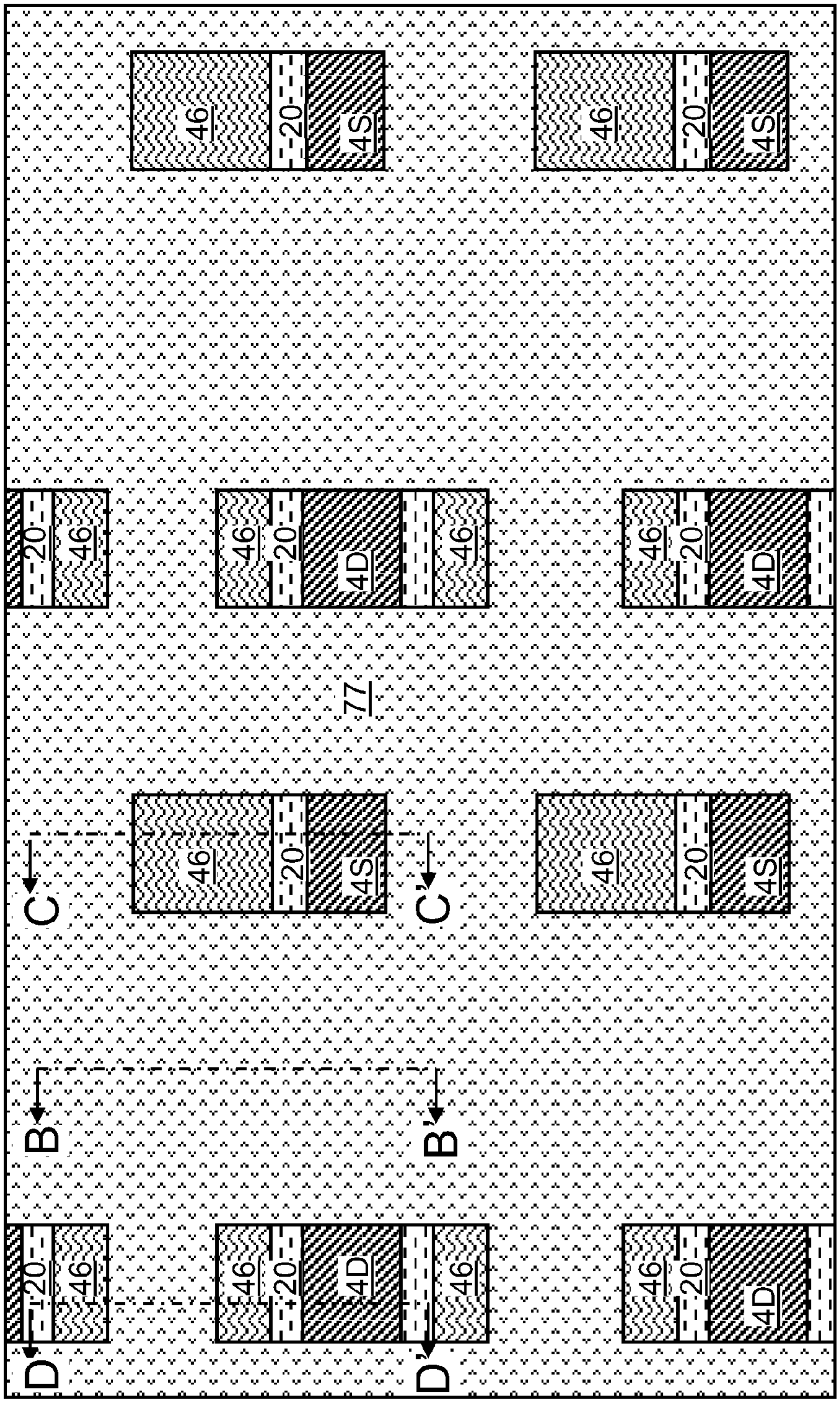
FIG. 10A is a top-down view of the first exemplary semiconductor structure after formation of various via cavities according to the first embodiment of the present disclosure.
Figure 10B:
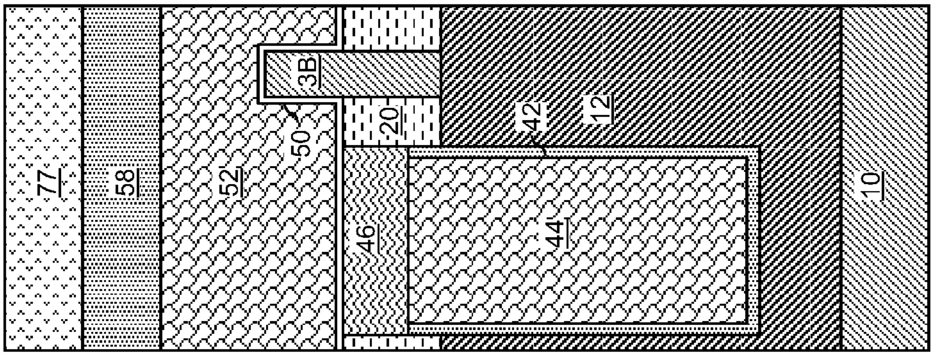
FIG. 10B is a vertical cross-sectional view of the first exemplary semiconductor structure along the vertical plane B-B' of FIG. 10A.
Figure 10C:
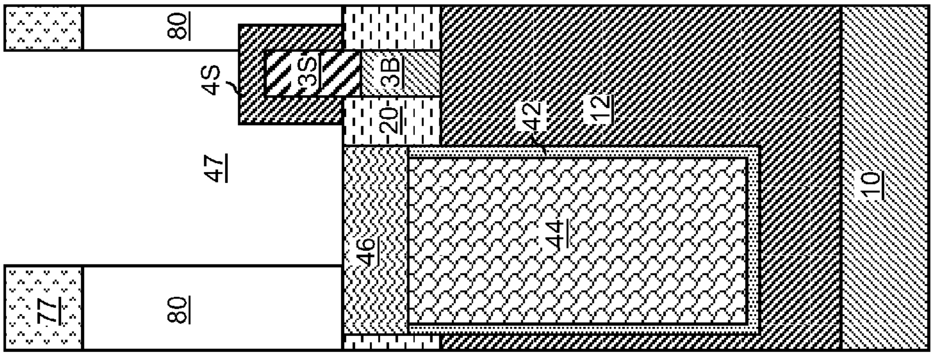
FIG. 10C is a vertical cross-sectional view of the first exemplary semiconductor structure along the vertical plane C-C' of FIG. 10A.
Figure 10D:
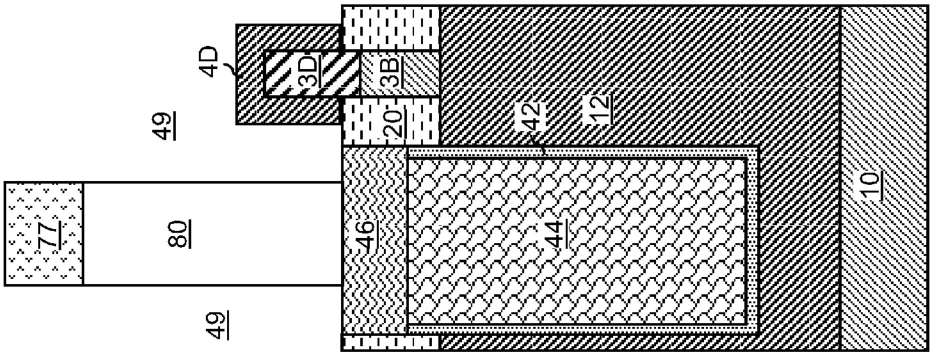
FIG. 10D is a vertical cross-sectional view of the first exemplary semiconductor structure along the vertical plane D-D' of FIG. 10A.
Figure 11A:
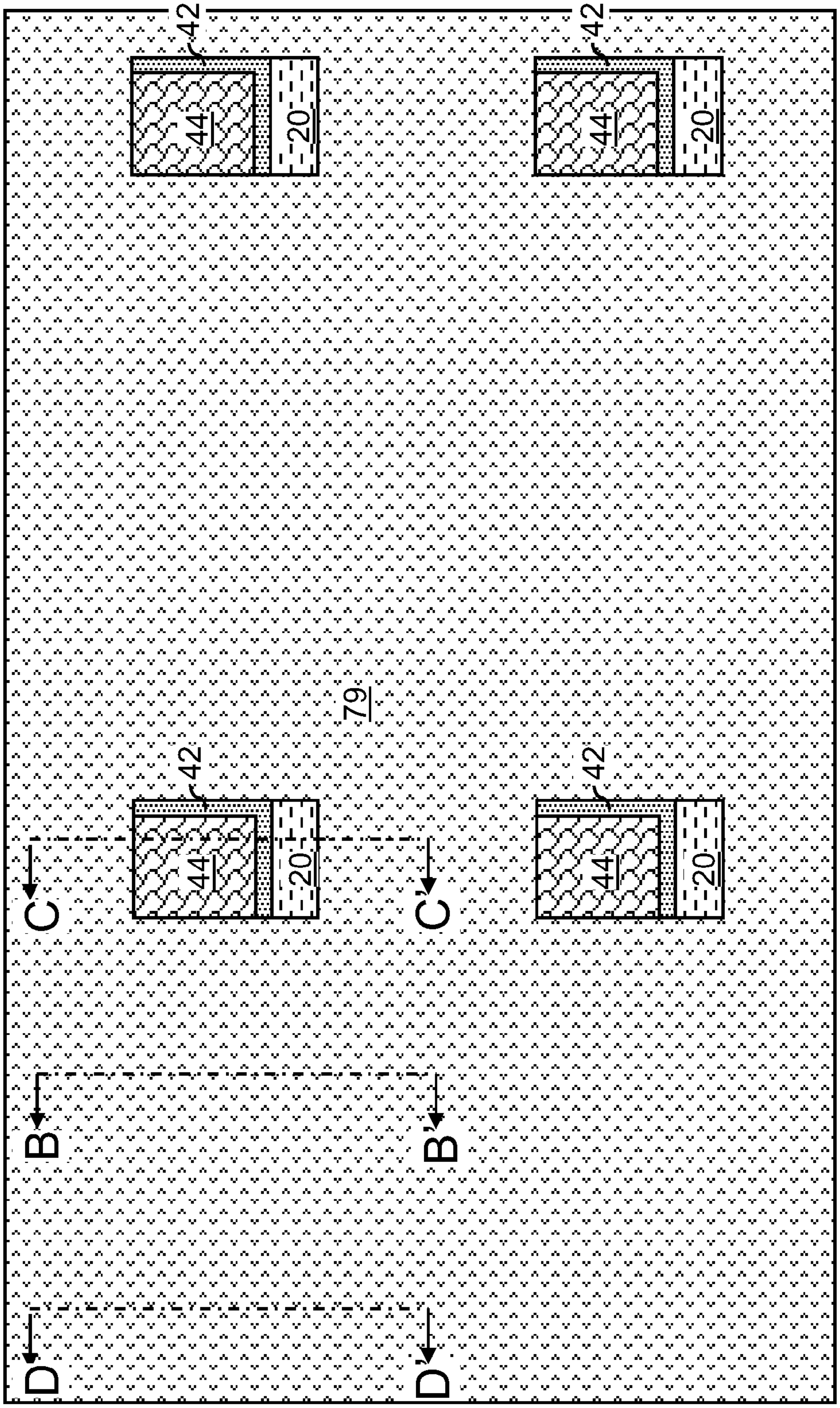
FIG. 11A is a top-down view of the first exemplary semiconductor structure after formation of fin level via cavities according to the first embodiment of the present disclosure.
Figure 11B:
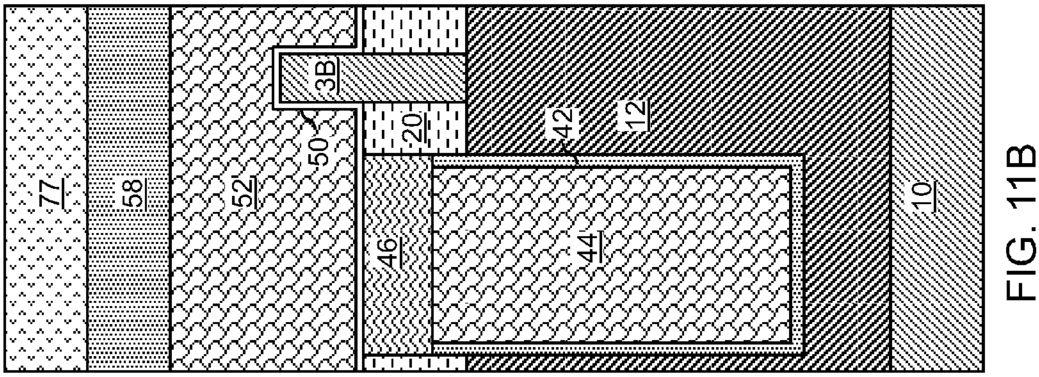
FIG. 11B is a vertical cross-sectional view of the first exemplary semiconductor structure along the vertical plane B-B' of FIG. 11A.
Figure 11C:
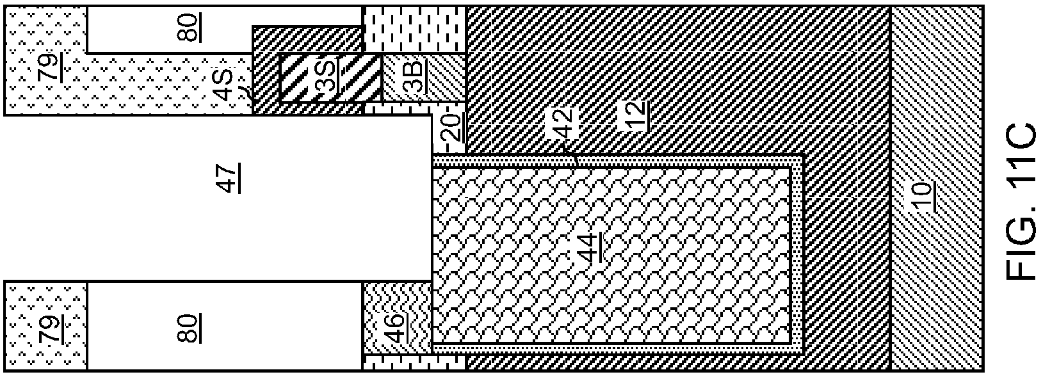
FIG. 11C is a vertical cross-sectional view of the first exemplary semiconductor structure along the vertical plane C-C' of FIG. 11A.
Figure 11D:
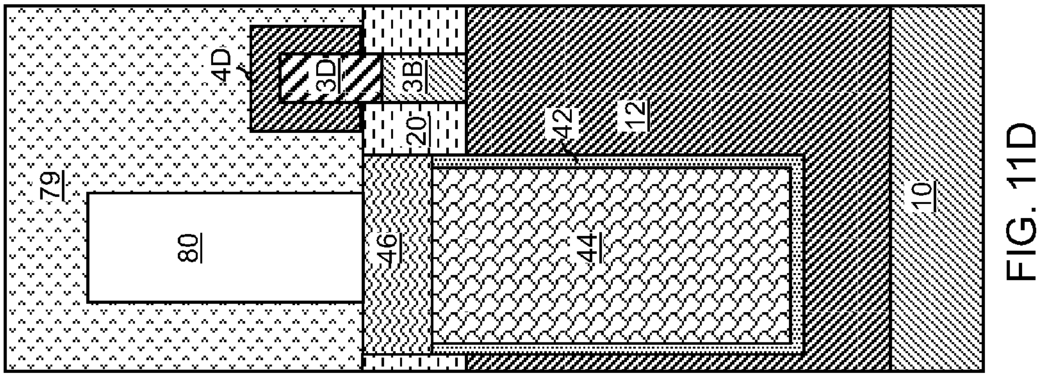
FIG. 11D is a vertical cross-sectional view of the first exemplary semiconductor structure along the vertical plane D-D' of FIG. 11A.
Figure 12A:
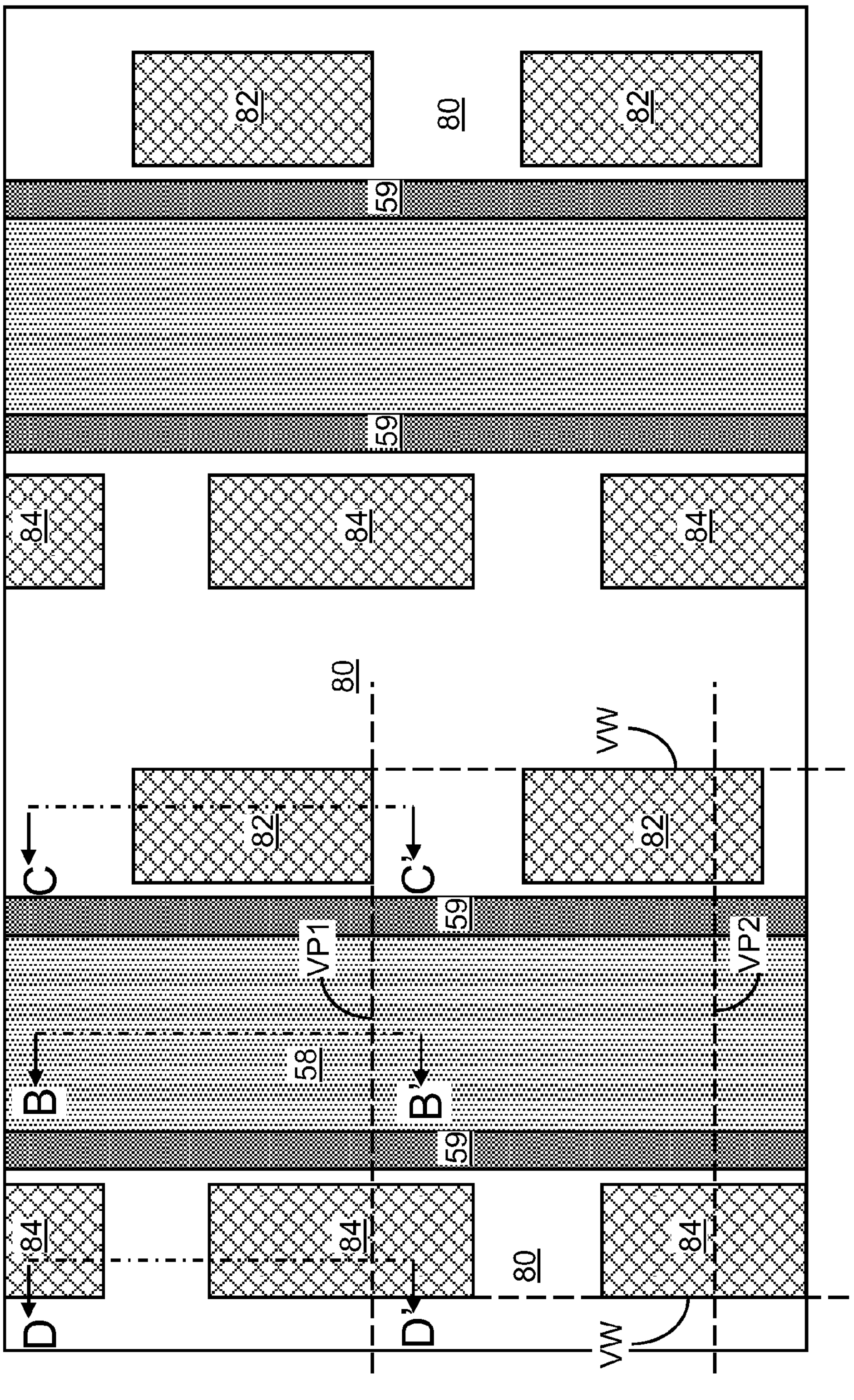
FIG. 12A is a top-down view of the first exemplary semiconductor structure after formation of various contact via structures according to the first embodiment of the present disclosure.
Figure 12D:
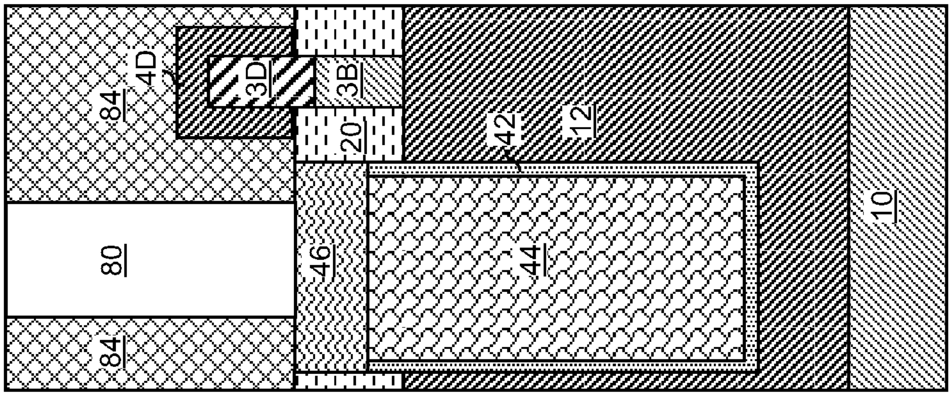
FIG. 12D is a vertical cross-sectional view of the first exemplary semiconductor structure along the vertical plane D-D' of FIG. 12A.
Figure 12C:
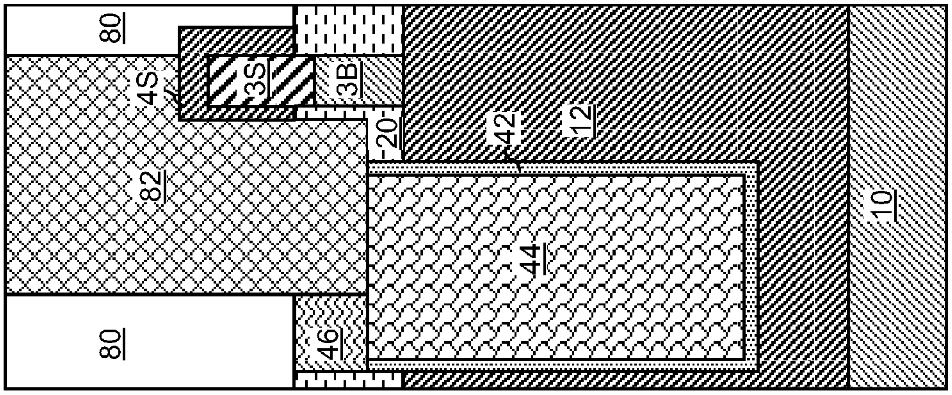
FIG. 12C is a vertical cross-sectional view of the first exemplary semiconductor structure along the vertical plane C-C' of FIG. 12A.
Figure 12B:
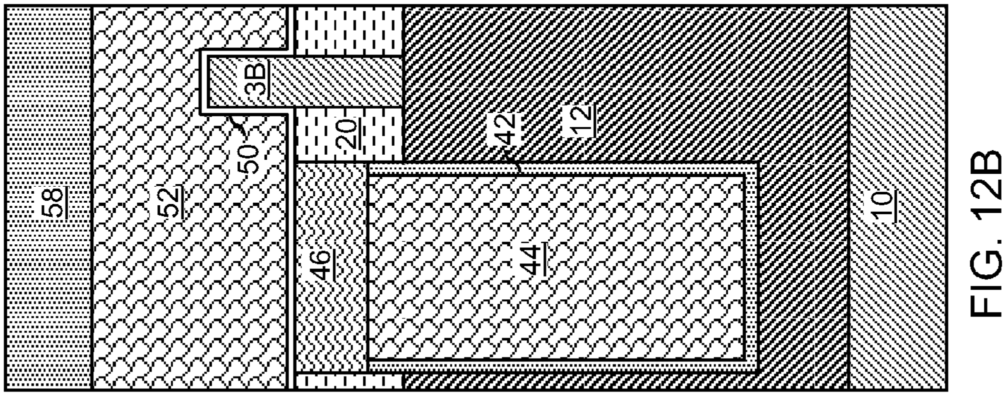
FIG. 12B is a vertical cross-sectional view of the first exemplary semiconductor structure along the vertical plane B-B' of FIG. 12A.

Referring to FIGS. 9A, 9B, and 9C, a planarization dielectric layer 80 is formed over the plurality of semiconductor fins (3S, 3D, 3B) and the gate structures (50, 52, 58). The planarization dielectric layer 80 can be formed, for example, by spin-on coating or chemical vapor deposition (CVD) of a dielectric material. The planarization dielectric layer 80 may include a single dielectric material layer, or may include a plurality of dielectric material layers. Excess portions of the deposited dielectric material layer can be removed from above the horizontal plane including the top surfaces of the gate cap dielectrics 58, for example, by chemical mechanical planarization.

Optionally, the gate structures (50, 52, 58) may be replaced with replacement gate structures employing methods known in the art. In this case, the removal of the gate structures (50, 52) can be performed employing at least one etch that is selective to the dielectric material of the planarization dielectric layer 80. Formation of the replacement gate structures can be formed by depositing a gate dielectric layer and a conductive material layer, and removing excess portions of the gate dielectric layer and the conductive material layer from above the top surface of the planarization dielectric layer 80, for example, by chemical mechanical planarization (CMP).

Referring to FIGS. 10A-10D, various via cavities (47, 49) can be performed by application of a first photoresist layer 77 above the planarization dielectric layer, lithographic patterning of the first photoresist layer 77, and transfer of the pattern in the first photoresist layer 77 into the planarization dielectric layer by an anisotropic etch such as a reactive ion etch.

The via cavities can include strap cavities 47 that overlies a portion of a trench top dielectric portion 46 and a raised source region 4S (or a source region 3S if a raised source region is not present). If raised source regions 4S are present in the first exemplary semiconductor structure, a top surface of a trench top dielectric portion 46, a sidewall surface and a top surface of a raised source region 4S, and a surface of the shallow trench isolation layer 20 between the sidewall surface of the raised source region 4S and the trench top dielectric portion 46 can be physically exposed within each strap cavity 47. If raised source regions are not present in the first exemplary semiconductor structure, a top surface of a trench top dielectric portion 46, a sidewall surface and a top surface of a source region 3S, and a surface of the shallow trench isolation layer 20 between the sidewall surface of the raised source region 4S and the trench top dielectric portion 46 can be physically exposed within each strap cavity 47.

The via cavities can include drain cavities 49 that overlie the raised drain regions 4D, or the drain regions 3D if raised drain regions are not present in the first exemplary semiconductor structure. If raised drain regions 4D are present in the first exemplary semiconductor structure, a top surface and sidewall surfaces of a raised drain region 4D and a top surface of the shallow trench isolation layer 20 and optionally, at least one top surface of the trench top dielectric portions 46 can be physically exposed within each drain cavities 49. If raised drain regions are not present in the first exemplary semiconductor structure, a top surface and sidewall surfaces of a drain region 3D and a top surface of the shallow trench isolation layer 20 and optionally, at least one top surface of the trench top dielectric portions 46 can be physically exposed within each drain cavities 49. The first photoresist layer 77 can be removed, for example, by ashing.

Referring to FIGS. 11A-11D, a second photoresist layer 79 is applied over the planarization dielectric layer 80, and is lithographically patterned to form openings overlying physically exposed surfaces of a trench top dielectric portion 46 within each strap cavity 47. Thus, the area of openings within the second photoresist layer 79 can overlap with the areas of the physically exposed surfaces of the trench top dielectric portion 46 within the strap cavities 47 prior to application of the second photoresist layer 79. In one embodiment, a sidewall of the patterned photoresist layer 79 can contact a top surface of each raised source region 4S, or each source region 4S if raised source regions are not present.

The pattern in the second photoresist layer 79 is transferred through the trench top dielectric portions 46 and any portions of the node dielectrics 42 and the shallow trench isolation layer 20 that underlie the openings within the second photoresist layer 79 by an anisotropic etch. Each strap cavity 47 is vertically extended through a trench top dielectric portion 46, and a top surface of an inner electrode 44 is physically exposed at the bottom of each vertically extended strap cavity 47 after the anisotropic etch. The second photoresist layer 79 is subsequently removed, for example, by ashing.

Referring to FIGS. 12A-12D, the via cavities (47, 49) can be filled with a conductive material by chemical vapor deposition or physical vapor deposition, and excess portions of the conductive material can be removed from above the top surface of the planarization dielectric layer 80, for example, by chemical mechanical planarization. Conductive structures (82, 84) are formed within the via cavities. The conductive structures (42, 48) can include drain contact via structures 84 that fill the drain cavities 49 and contact the raised drain regions 4D and/or the drain regions 3D. Further, the various conductive structures (82, 84) can include conductive strap structures 82 that fill the strap cavities 47 as extended by the anisotropic etch at the processing steps of FIGS. 11A-11D. Each conductive strap structure 82 can electrically short a source region 3S in the one of the semiconductor fins (3S, 3D, 3B) and an inner electrode 44 in one of the trench capacitors (12, 42, 44).

The first exemplary semiconductor structure includes at least semiconductor fins (3S, 3D, 3B) located on a substrate (10, 12), and a trench capacitor (12, 42, 44) located within the substrate (10, 12). The entirety of a node dielectric 42 of the trench capacitor (12, 42, 44) can be located between a first vertical plane VP1 including a proximal lengthwise sidewall of a first semiconductor fin within a neighboring pair of the semiconductor fins 30 and a second vertical plane VP2 including a proximal lengthwise sidewall of a second semiconductor fin within the neighboring pair of the semiconductor fins 30. The entirety of the node dielectric 42 of the trench capacitor (12, 42, 44) can be located between a pair of vertical planes including two widthwise sidewalls of the first semiconductor fin. A trench top dielectric portion 46 overlies the trench capacitor (12, 42, 44) and is laterally bounded by the first vertical plane VP1 and the second vertical plane VP2. A gate structure (50, 52, 58) straddles the first and second semiconductor fins and overlying the trench top dielectric portion 46. The shallow trench isolation layer 12 laterally surrounds lower portions of the semiconductor fins (3S, 3D, 3B) and contacts the trench top dielectric portion 46 and the node dielectric 42. A conductive strap structure 82 can contact the raised source region 4S or the source region 3S, and contacts the inner electrode 44 of the trench capacitor (12, 42, 44).

Figure 13A:
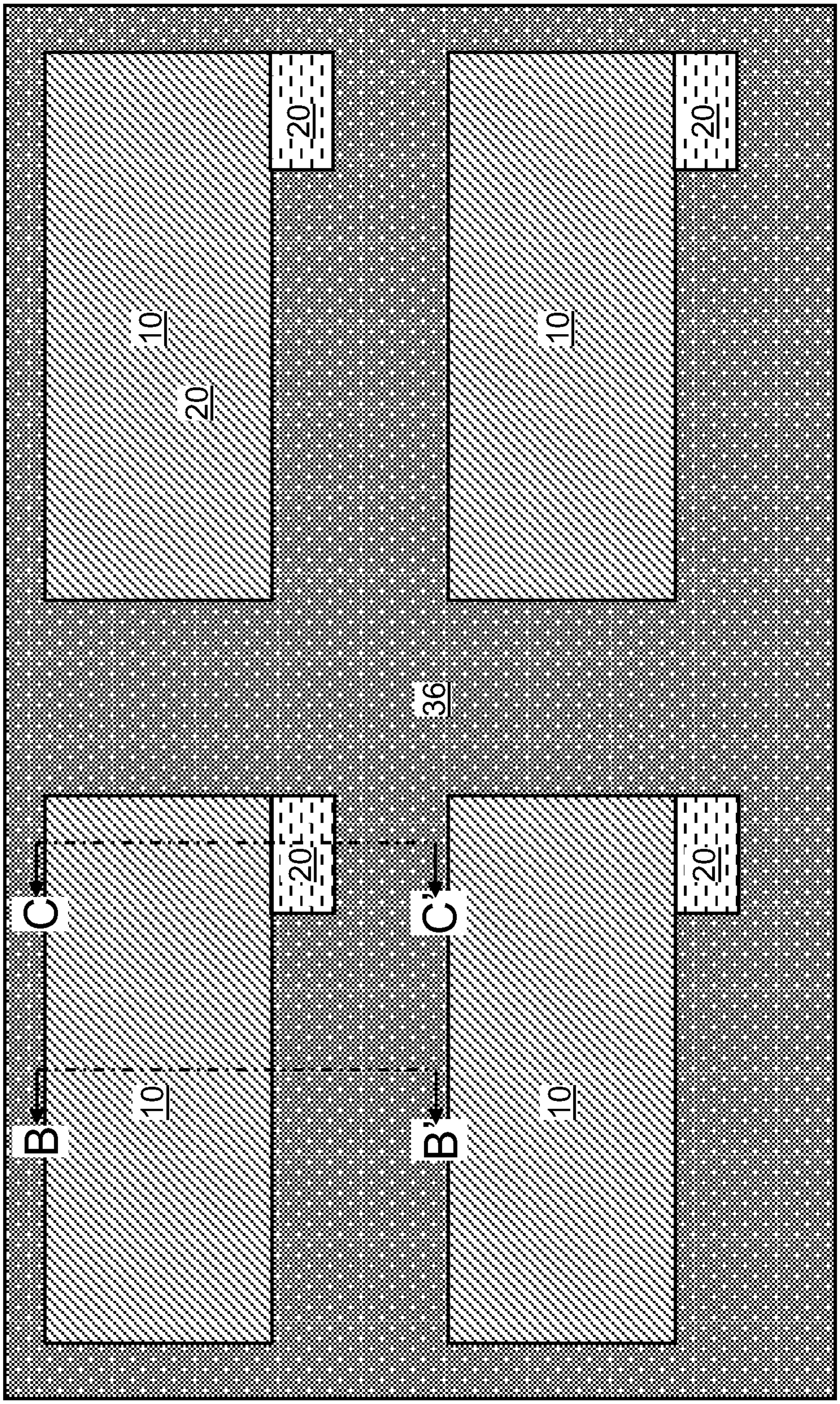
FIG. 13A is a top-down view of a second exemplary semiconductor structure after recessing portions of the shallow trench isolation layer between pairs of a trench and a semiconductor fin according to the second embodiment of the present disclosure.
Figure 13C:
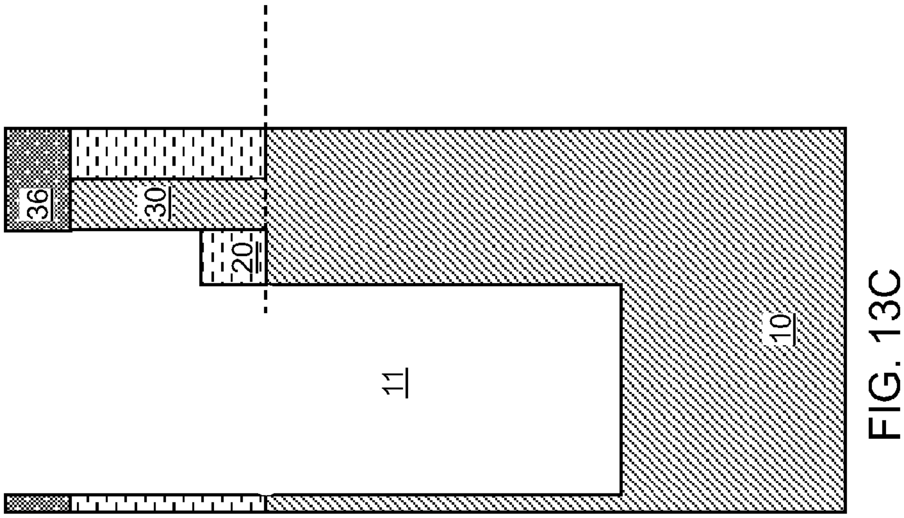
FIG. 13C is a vertical cross-sectional view of the second exemplary semiconductor structure along the vertical plane C-C' of FIG. 13A.
Figure 13B:
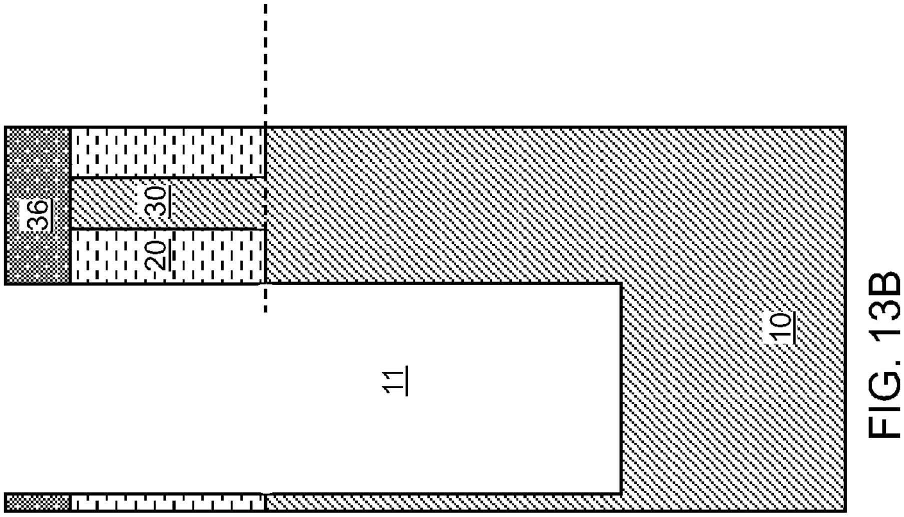
FIG. 13B is a vertical cross-sectional view of the second exemplary semiconductor structure along the vertical plane B-B' of FIG. 13A.

Referring to FIGS. 13A, 13B, and 13C, a second exemplary semiconductor structure according to the second embodiment of the present disclosure can be derived from the first exemplary semiconductor structure of FIGS. 4A and 4B by applying a photoresist layer over the hard mask layer 36, patterning the photoresist layer to include openings of the same shapes as the openings in the second photoresist layer 79 in the processing steps of FIGS. 11A-11D, transferring the pattern of the openings through the hard mask layer 36 and an upper portion of the shallow trench isolation layer 20 by an anisotropic etch, and removing the photoresist layer. Thus, a portion of the shallow trench isolation layer 20 is recessed between a semiconductor fin 30 and the inner electrode of a trench capacitor (12, 42, 44) within a same memory cell.

Figure 14A:
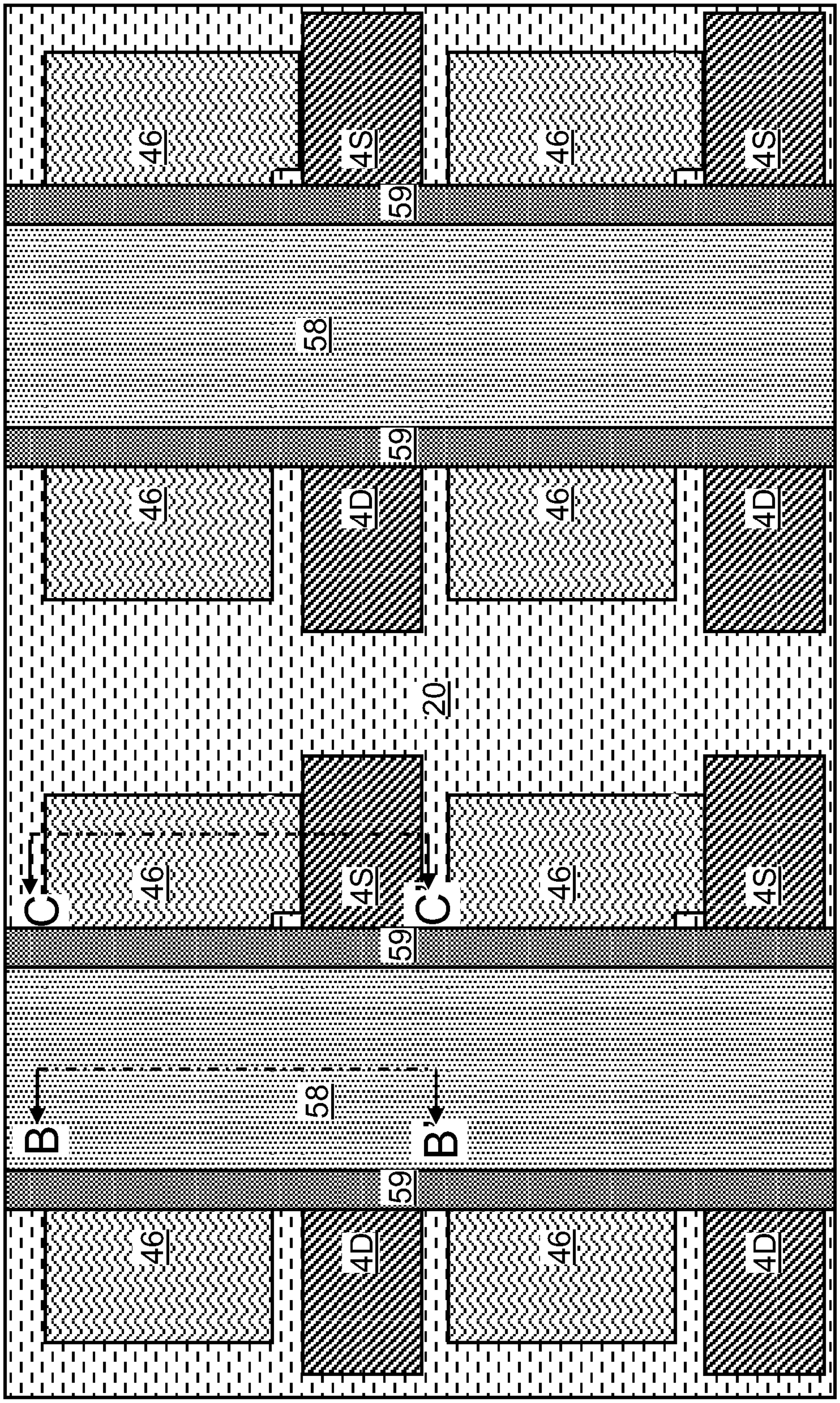
FIG. 14A is a top-down view of the second exemplary semiconductor structure after formation of trench capacitors, buried straps, trench top dielectric portions, gate structures, source regions, drain regions, raised source region, and raised drain regions according to the second embodiment of the present disclosure.
Figure 14C:
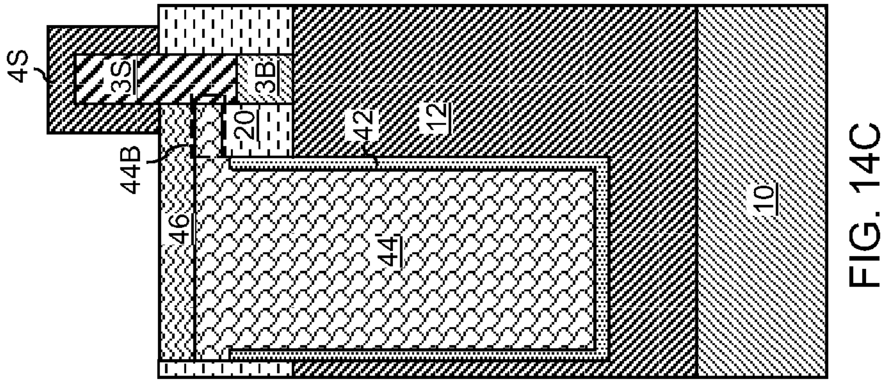
FIG. 14C is a vertical cross-sectional view of the second exemplary semiconductor structure along the vertical plane C-C' of FIG. 14A.
Figure 14B:
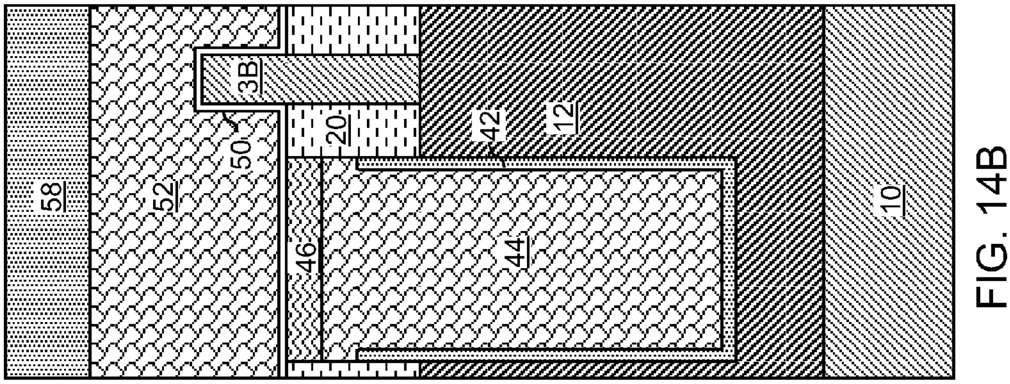
FIG. 14B is a vertical cross-sectional view of the second exemplary semiconductor structure along the vertical plane B-B' of FIG. 14A.
Figure 15A:
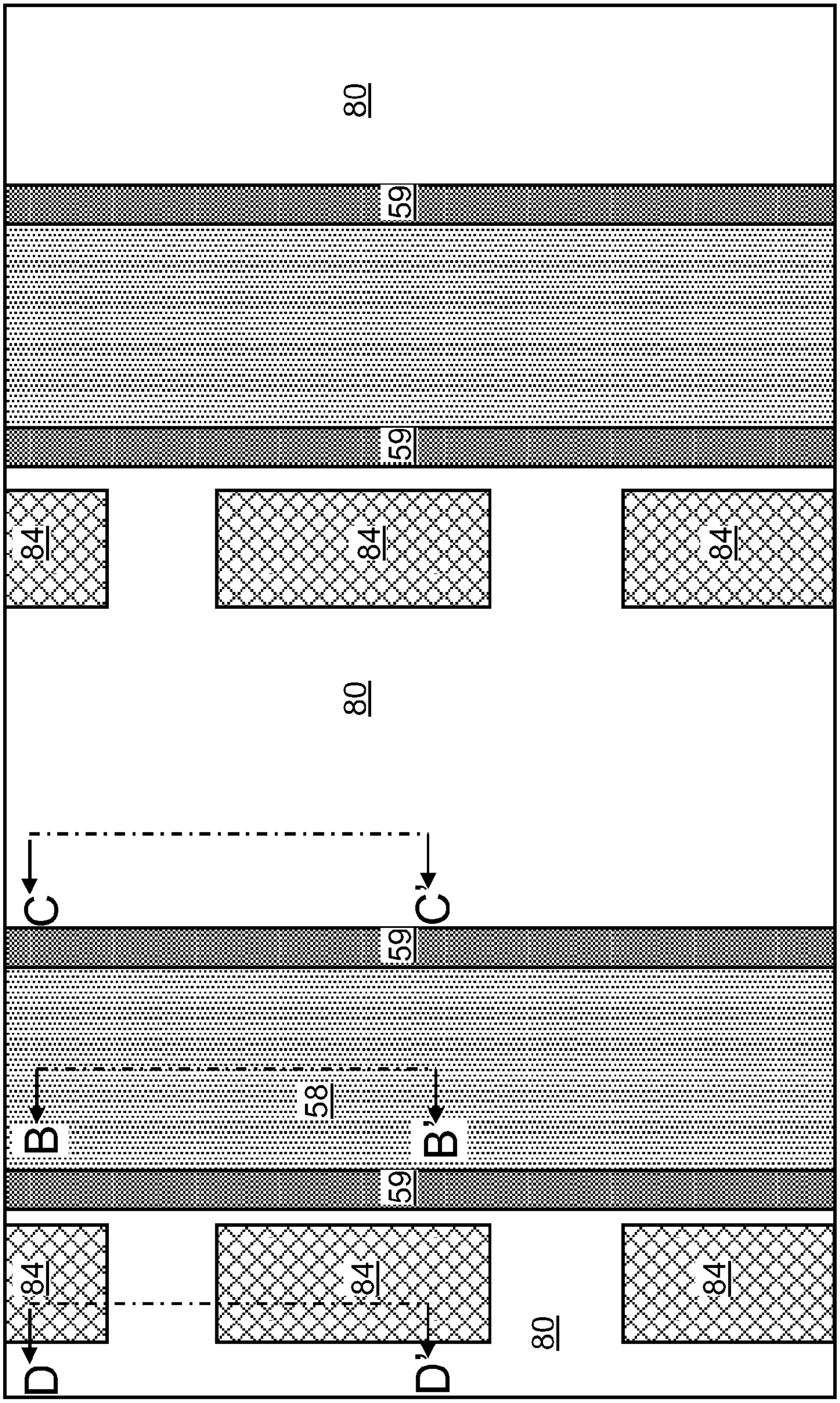
FIG. 15A is a top-down view of the second exemplary semiconductor structure after formation of drain contact structures according to the second embodiment of the present disclosure.
Figure 15B:
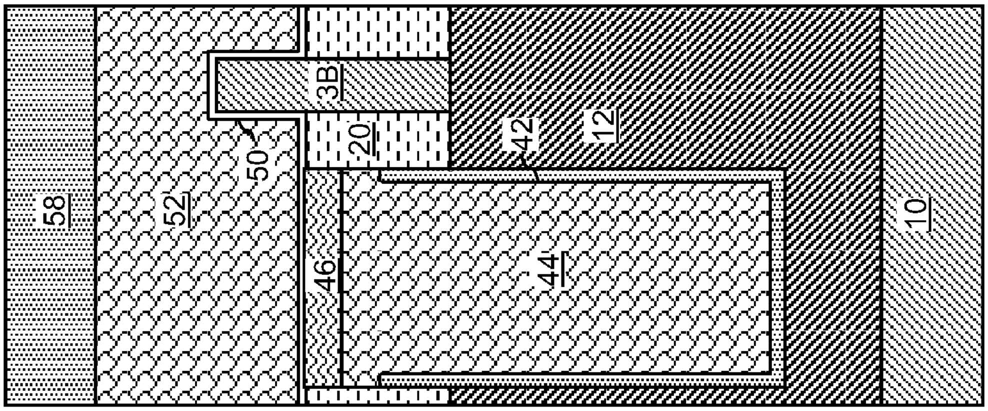
FIG. 15B is a vertical cross-sectional view of the second exemplary semiconductor structure along the vertical plane B-B' of FIG. 15A.
Figure 15C:
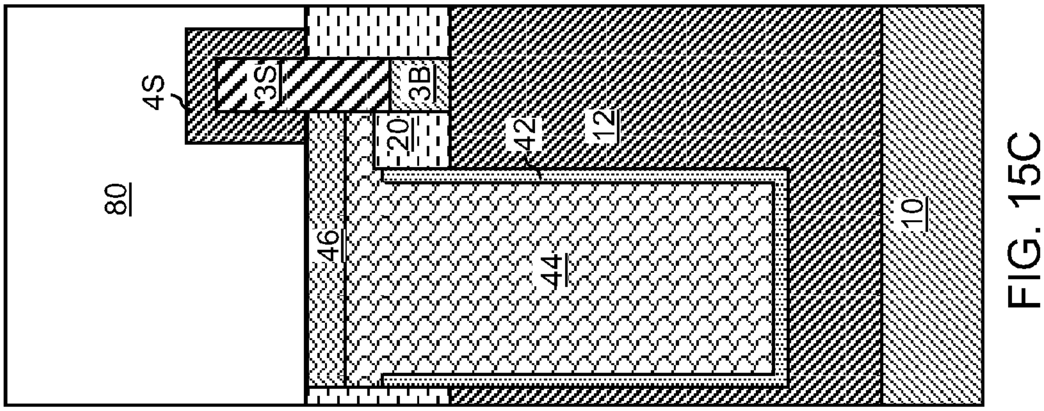
FIG. 15C is a vertical cross-sectional view of the second exemplary semiconductor structure along the vertical plane C-C' of FIG. 15A.
Figure 15D:
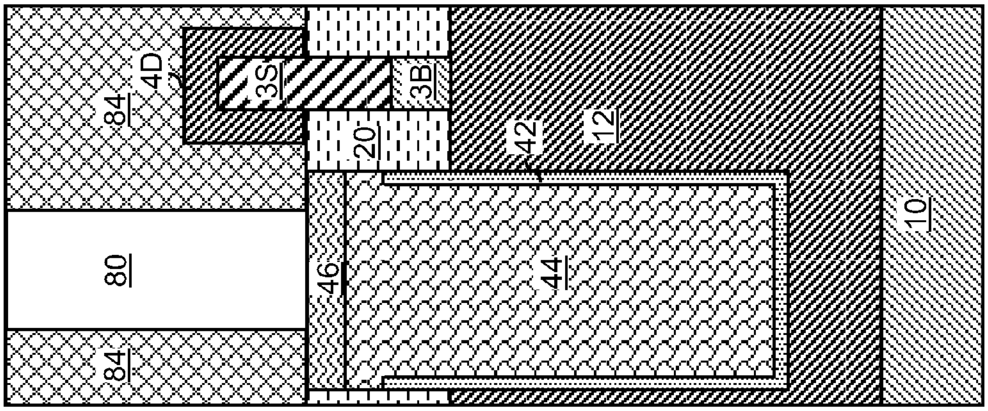
FIG. 15D is a vertical cross-sectional view of the second exemplary semiconductor structure along the vertical plane D-D' of FIG. 15A.

Referring to FIGS. 14A-14C, the processing steps of FIGS. 5A, 5B, 6A, 6B, 7A, 7B, and 8A-8C are sequentially performed to form trench top dielectric portions 46, source regions 3S, drain regions 3D, body regions 3B, gate structures (50, 52, 58), gate spacers 56, raised source regions 4S, and raised drain regions 4D. A buried strap portion 44B is formed as a sub-portion of an inner electrode 44 within the recessed portion of the shallow trench isolation layer 20 and on the source region 3S.

Referring to FIGS. 15A-15D, the processing steps of FIGS. 9A-9C, 10A-10D, 12A-12D are sequentially performed with the modification that the strap cavities 47 (See FIGS. 10A-10D) and the conductive strap structures 82 are not formed. The function of the conductive strap structures 82 in the first exemplary semiconductor structure is performed by the buried strap portions 44B in the second exemplary semiconductor structure.

The various embodiments of the present disclosure provide layouts for a dynamic random access memory cell in which trench capacitors are formed between two lengthwise edges of a neighboring pair of semiconductor fins that are laterally spaced from each other along the widthwise direction of the semiconductor fins. By forming the trench capacitors between semiconductor fins, a shallow trench isolation layer can provide electrical isolation between buried plates and access transistors for the trench capacitors, and suppress leakage paths between the field effect transistors and the buried plates. Further, conductive strap structures or buried strap portions provide an electrically conductive path between the source region of each access transistor and the inner electrode of the corresponding trench capacitor.

While the disclosure has been described in terms of specific embodiments, it is evident in view of the foregoing description that numerous alternatives, modifications and variations will be apparent to those skilled in the art. Each of the embodiments described herein can be implemented individually or in combination with any other embodiment unless expressly stated otherwise or clearly incompatible. Accordingly, the disclosure is intended to encompass all such alternatives, modifications and variations which fall within the scope and spirit of the disclosure and the following claims.

What is claimed is:

1. A semiconductor structure comprising:

semiconductor fins located on a substrate; and a trench capacitor located within said substrate, wherein an entirety of a node dielectric of said trench capacitor is located between a first vertical plane including a proximal lengthwise sidewall of a first semiconductor fin within a neighboring pair of said semiconductor fins and a second vertical plane including a proximal lengthwise sidewall of a second semiconductor fin within said neighboring pair of said semiconductor fins.

2. The semiconductor structure of claim 1, wherein said entirety of said node dielectric of said trench capacitor is located between a pair of vertical planes including two widthwise sidewalls of said first semiconductor fin.

3. The semiconductor structure of claim 1, further comprising a trench top dielectric portion overlying said trench capacitor and laterally bounded by said first vertical plane and said second vertical plane.

4. The semiconductor structure of claim 3, further comprising a gate structure straddling said first and second semiconductor fins and overlying said trench top dielectric portion.

5. The semiconductor structure of claim 3, further comprising a shallow trench isolation layer laterally surrounding lower portions of said semiconductor fins and contacting said trench top dielectric portion and said node dielectric.

6. The semiconductor structure of claim 1, wherein said substrate is a portion of a contiguous semiconductor material portion that includes a buried plate laterally surrounding said node dielectric and said semiconductor fins.

7. The semiconductor structure of claim 6, further comprising a shallow trench isolation layer laterally surrounding lower portions of said semiconductor fins.

8. The semiconductor structure of claim 1, wherein a source region within said first semiconductor fin is electrically shorted to an inner electrode of said trench capacitor.

9. The semiconductor structure of claim 8, further comprising:

a raised source region located on a top surface and sidewalls of said source region; and a conductive strap structure contacting said raised source region and said inner electrode of said trench capacitor.

10. The semiconductor structure of claim 8, wherein said inner electrode comprises a buried strap portion contacting said source region.

11. A method of forming a semiconductor structure comprising:

forming semiconductor fins on a substrate; and forming an entirety of a node dielectric of a trench capacitor within said substrate between a first vertical plane including a proximal lengthwise sidewall of a first semiconductor fin within a neighboring pair of said semiconductor fins and a second vertical plane including a proximal lengthwise sidewall of a second semiconductor fin within said neighboring pair of said semiconductor fins.

12. The method of claim 11, wherein said entirety of said node dielectric of said trench capacitor is forming between a pair of vertical planes including two widthwise sidewalls of said first semiconductor fin.

13. The method of claim 11, further comprising forming a trench top dielectric portion over said trench capacitor and within a region laterally bounded by said first vertical plane and said second vertical plane.

14. The method of claim 13, further comprising forming a gate structure across said first and second semiconductor fins and over said trench top dielectric portion.

15. The method of claim 13, further comprising forming a shallow trench isolation layer around lower portions of said semiconductor fins, wherein said trench top dielectric portion and said node dielectric are formed directly on said shallow trench isolation layer.

16. The method of claim 11, wherein said semiconductor fins are formed by patterning an upper portion of a bulk semiconductor substrate, and said substrate is a remaining portion of said bulk semiconductor substrate underlying said semiconductor fins.

17. The method of claim 16, further comprising forming a shallow trench isolation layer around lower portions of said semiconductor fins.

18. The method of claim 11, further comprising electrically shorting a source region within said first semiconductor fin to an inner electrode of said trench capacitor.

19. The method of claim 18, further comprising:

forming a raised source region on a top surface and sidewalls of said source region; and forming a conductive strap structure on said raised source region and said inner electrode of said trench capacitor.

20. The method of claim 18, further comprising:

forming a shallow trench isolation layer around said semiconductor fins; and recessing a portion of said shallow trench isolation layer between said first semiconductor fin and said inner electrode of said trench capacitor; and forming a buried strap portion within said recessed portion of said shallow trench isolation layer and on said source region.

* * * * *